(12) United States Patent
Johnson et al.

(10) Patent No.: US 6,859,474 B1
(45) Date of Patent: Feb. 22, 2005

(54) LONG WAVELENGTH PSEUDOMORPHIC INGANPASSB TYPE-I AND TYPE-II ACTIVE LAYERS FOR THE GAAS MATERIAL SYSTEM

(75) Inventors: Shane Johnson, Chandler, AZ (US); Philip Dowd, Tempe, AZ (US); Wolfgang Braun, Berlin (DE); Yong-Hang Zhang, Scottsdale, AZ (US); Chang-Zhi Guo, Beijing (CN)

(73) Assignee: Arizona Board of Regents, Tempe, AZ (US)

( * ) Notice: Subject to any disclaimer, the term of this patent is extended or adjusted under 35 U.S.C. 154(b) by 56 days.

(21) Appl. No.: 10/129,061

(22) PCT Filed: Nov. 1, 2000

(86) PCT No.: PCT/US00/41775

§ 371 (c)(1),
(2), (4) Date: Apr. 29, 2002

(87) PCT Pub. No.: WO01/33677

PCT Pub. Date: May 10, 2001

Related U.S. Application Data

(60) Provisional application No. 60/162,813, filed on Nov. 1, 1999.

(51) Int. Cl.$^7$ .............................. H01S 5/00; H01L 29/06
(52) U.S. Cl. .............................. 372/43; 372/45; 372/46; 257/18
(58) Field of Search .............................. 372/43, 45, 46, 372/50, 92, 96, 18, 190

(56) References Cited

U.S. PATENT DOCUMENTS 5,960,018 A * 9/1999 Jewell et al. .................. 372/45

FOREIGN PATENT DOCUMENTS

| EP | 0833395 | * | 4/1998 |
| EP | 0896406 | * | 2/1999 |

OTHER PUBLICATIONS

Hains et al, Room temperature pulsed operation of triple–quantum–well GAINNAS substrates by MOCVD, IEEE Photonics technology letters, vol. 11, No. 10, Oct. 19999, pp. 1208–1210.*

Gohale et al, High–performance–ling–wavelength (lambda 1.3 MUM) INGAASPN IEEE photonics technology letters, vol. 11, No. 10, Aug. 1999, pp. 1041–1135.*

(List continued on next page.)

Primary Examiner—Don Wong
Assistant Examiner—Armando Rodriguez
(74) Attorney, Agent, or Firm—Gallagher & Kennedy, P.A.; Thomas D. MacBlain

(57) ABSTRACT

The invention discloses improved structures of light-processing (e.g. light-emitting and light-absorbing/sensing) devices, in particular Vertical Cavity Surface Emitting Lasers (VCSELs), such as may find use in telecommunications applications. The disclosed VSCAL devices and production methods provide for an active region having a quantum well structure grown on GaAs-containing substrates, thus providing processing compatibility for light having wavelength in the range 1.0 to 1.6 μm. The active region structure combines strain-compensating barriers with different band alignments in the quantum wells to achieve a long emission wavelength while at the same time decreasing the strain in the structure. The improved functioning of the devices disclosed results from building them with multi-component alloy layers having a large number of constituents. The invention discloses as a key constituent in the proposed alloy layers for the active region a substance, such as nitrogen (N), suitable for reducing bandgap energy (i.e., increasing light wavelength) associated with the layers while at the same time lowering the lattice constant associated with the structure and hence lowering strain.

43 Claims, 20 Drawing Sheets

OTHER PUBLICATIONS

Miyamoto et al, Anovel GALNNAS–GAAS quantum–well structure for long wavelength semiconductor lasers, IEEE photonics technology letters, vol. 9, No. 11, Nov. 1997, pp. 1448–1450.*

Johnson et al, Long wavelength pseudomorphic InGaPAsSb type–I and type–II active layers frown on GaAs, 18th north american conference on molecular beam eptaxy, Oct. 1999, vol. 18, No. 3, pp. 1545–1548.*

* cited by examiner

LONG WAVELENGTH PSEUDOMORPHIC INGANPASSB TYPE-I AND TYPE-II ACTIVE LAYERS FOR THE GAAS MATERIAL SYSTEM

This application claims the benefit of Provisional application Ser. No. 60/162,813, filed Nov. 1, 1999.

Vertical-cavity surface-emitting lasers (VCSELs) operating at 1.3 µm and 1.5 µm are desirable for low cost optical telecommunication systems and data links. Realization of these devices may enable digital communications applications such as "fiber to the home," which operate over distances of only a few kilometers. Whereas lasers operating at a wavelength 1.3 µm are interesting for high-speed communication since they operate at the dispersion minimum of optical fibers, lasers at 1.55 µm are interesting for communications over larger distances as they transmit in the absorption minimum. Also, long-wavelength lasers have a low operating voltage, which makes them attractive for integration with integrated Si-based circuitry in which the trend has been toward lower and lower operating voltages with higher integration density. Due to the potentially-large market for 1.3 and 1.5 µm VCSELs, much research has been carried out to develop devices using different approaches based primarily on two substrates, InP and GaAs. Whereas InP has been the traditional substrate material for edge-emitting lasers, GaAs offers advantages in terms of lower substrate cost and potentially higher device performance.

In general, VCSELs are light emitting semiconductor devices including two Distributed Bragg Reflectors (DBRs) between which lies an active region possessing a material emitting the desired wavelength of light. A typical VCSEL structure is shown schematically in FIG. 1. In this case, the active region consists of several InGaAs quantum wells separated by GaAs barriers and illustrates the general conduction band-edge alignment required in an active region. The semiconductor structure is designed to have the minimum separation between the electrons and the holes in the active zone, where the two carrier types recombine and emit light. The wavelength of the emitted light is determined by the energy separation between electrons and holes in this active zone. The particular active region shown is designed for emission at about 980 nm, but the same design procedures are required at longer wavelengths also. An $Al_xGa_{1-x}As$ spacer is used to define the cavity length, which matches a multiple of half the wavelength of the lasing wavelength λ. The composition is shown along with the relative refractive indices and bandgaps of the different layers. Since the active region in a VCSEL is short, typically significantly less than the lasing wavelength (λ), photons passing through the active region experience only a small single-pass optical gain. Therefore, to achieve lasing action, highly reflective structures are required on both sides of the active region. This may readily be achieved by using the same epitaxial growth process as required to fabricate the active region, or by techniques such as dielectric deposition. The mirrors consist of alternate λ/4 layers of materials with different refractive indices. At the lasing wavelength, the partial waves reflected at the interfaces between these layers interfere constructively, resulting in a very high reflectance within a narrow spectral region. The thin-film stacks on both sides of the active region form so-called distributed Bragg reflectors (DBRs), with typical reflectivities of 99% or higher.

A waveguiding structure for the optical mode is required, for instance in the configuration illustrated in in FIG. 2. In an index-guided device as shown in FIG. 2, the optical mode is confined by etching away the material around a pillar-shaped volume to form an air-post device. The current is then also confined to the pillar area. Alternatively gain guiding may be used. Very high resistivity regions may be created by firing high energy protons or ions into the device. This defines an area through which the current funnels into the active region. The gain region is confined laterally, and the mode forms in the free area. A combination of these schemes may also be used. A more recent development is the oxide-confined device. Selectively oxidizing mirror layers to form $Al_xO_y$ cladding layers provides both current confinement and index guiding, which can result in devices with very low threshold currents.

The operating principle of a light emitting structure can be reversed. If light of the appropriate wavelength is directed on such a device, a current is generated at the two terminals, allowing the operation as a detector. For high performance detectors, different optimizations are needed, making the optimal structure different from an emitter. A typical structure is shown in FIG. 3. The active regions for both the light emitter and the detector, however, use the same general type of layer structure.

VCSELs require laser-quality active materials and high reflectivity DBR mirrors. Problems commonly encountered in the production of prior art VCSELs have been extensively reviewed by U.S. Pat. Nos. 5,719,894 and 5,719,895, which patents are hereby incorporated in full herein. Generally, the production of VCSELs emitting in the region of 1.3 to 1.55 µm may be complicated by the following problems:

(1) production of efficient DBRs for InP substrates is difficult and in practice has been found to be very ineffective;

(2) VCSELs grown using InP/InGaAsP have poor performance due to the materials high thermal sensitivity and refractive index properties; and (3) growth of laser-quality active material on GaAs has generally proven to be unsuccessful for prior art VCSELs.

The materials used for lattice-matched mirrors on InP substrates are InP and InGaAsP. These materials have shortcomings as well, viz:

(i) a small refractive index step; and (ii) poor thermal properties.

The small refractive index step manifests itself in the number of layers required to produce a DBR mirror with the desired reflectivity. When compared to AlGaAs stacks grown on GaAs, stacks grown on InP require more InP/InGaAsP layers to produce the same reflectivity, Additionally, InGaAsP displays a higher thermal resistance than GaAs or AlAs. This increases thermal problems of the device—e.g., heating of the active zone—, making it more difficult to achieve reliable continuous wave (CW) operation at room temperature. This problem is further exacerbated because more material is required in the mirrors, thus increasing the distance over which thermal conduction has to take place and at the same time increasing the heat-generating volume if the operating current is passed through these regions.

Whereas GaAs may offer significant advantages in terms of lower substrate cost, simpler crystal growth technology and higher reflectivity mirrors, the problem of growing high optical quality active material on GaAs is a problem that many researchers have attempted to tackle in numerous ways. One common method of solving this problem is through the use of gain offset as disclosed by Jewell et al. in U.S. Pat. Nos. 5,719,894 and 5,719,895, which are incorporated herein by reference. Although the methods outlined by Jewell et al. appear to have some attractive features, it is still generally found to be extremely difficult to achieve the desired wavelength emission using such methods because process parameters such as critical thickness are not sufficiently developed. Specifically with regard to U.S. Pat. No. 5,719,894, the following problems tend to be encountered:

1. As taught by Jewell et al., the incorporation of nitrogen (N) into semiconductor material, such as InGaAs to form InGaNAs, or GaInNAs—referred to as "Guinness", has been demonstrated to increase wavelength. The amount of N needed to reach 1.3 or even 1.55 μm, however, typically leads to high defect levels that adversely affect device performance and device lifetime. These problems increase dramatically with the amount of N that is incorporated.
2. Although some researchers believe that a quaternary alloy is formed, an alternative view still is that the N is incorporated as an impurity or defect state, leading to gain saturation.
3. The incorporation of N is technologically challenging. There are problems in reliably incorporating more than 1% N in the active material. Typically, the material is therefore grown at low temperature, leading to inferior crystal quality, and heat-treated afterwards. This process, however, cannot completely cure the defects introduced by the low temperature growth.

Additionally, with regard to U.S. Pat. No. 5,719,895, the following problems/disadvantages may be encountered when applying the technology to semiconductors:

1. The growth of InAs/GaAs superlattices is extremely difficult with current technology because of the large lattice mismatch between InAs and GaAs.
2. In highly-strained epitaxial growth, the layers do not grow smoothly, even well below the critical thickness. Layers can show surface roughness or corrugation and it is also possible for islanding to occur, resulting in the formation of quantum-dots, which for purposes of this invention may be regarded as functionally interchangeable with "quantum islands," with a drastic reduction in the volume of the active region.
3. The theoretical models used to describe the strain usually over-simplify the growth process. Other growth modes, such as Stranski-Krasmnov, will result in the formation of quantum dots for layer thickness well below the critical thickness. In the case where islands or dots are formed, the volume of the active region becomes significantly smaller. This will reduce the maximum achievable gain provided by the layer. Furthermore, there is likely to be an ensemble of sizes of dots, which results in broader spectra, with lower peak material gain.
4. Perfectly smooth layers up to the critical thickness have never, as far as is known, been realized experimentally for the structures proposed in connection with the present invention. Even in the case of a superlattice structure comprising a repeated unit of a single InAs layer and a GaAs layer, strain accumulation may result in surface roughening before the critical thickness is reached. Structural non-uniformities, such as corrugation, will cause spectral broadening and reduced gain.
5. Growth of these structures is also likely to result in the introduction of material defects (e.g, dislocations). This will severely reduce the material gain characteristics and the lifetime of any lasers produced from such material would be short.

One of the most promising, albeit complex, approaches to avoid the problems outlined above for prior art VCSELs has been to use wafer fusion, in which the active region and DBRs are grown with separate InP substrates and then bonded together to form the VCSEL. This may often result in a complicated fabrication process with the associated yield problems and a high cost of the individual device.

In order to ensure reliability and reproducibility, as well as to overcome the limitations of the InP/InGaAsP material system, there is continued interest in developing alternative structures based on GaAs, especially since GaAs-based technology is generally more advanced than that of InP. However, it is not straightforward to find materials that can be grown on GaAs with band-gaps that are suitable for 1.3 μm emission.

In one approach, quantum dot (QD) structures have been developed. InGaAs QDs have shown photoluminescence (PL) at 1.3 μm, and a resonant cavity photodiode operating at 1.27 μm has been realized. Recently, an edge-emitting QD laser operating close to 1.31 μm has also been demonstrated. Room temperature (RT) PL at 1.3 μm has been observed using strained GaAsSb quantum wells (QWs) and lasing has been reported in an edge-emitting device at 1.27 μm. An alternative allowing a longer emission wavelength of 1.18 μm was implemented in a GaAs-based VCSEL structure using a single GaInNAs QW, and RT pulsed operation. PL wavelengths of up to 1.33 μm have also been observed in GaAsSb/InGaAs bi-layer QW samples, with a type-II band-edge alignment. The feasibility of structures with type-II band-edge alignments for long wavelength devices has been demonstrated as well as the fabrication of edge-emitting LEDs.

SUMMARY OF THE INVENTION

The present invention overcomes the problems encountered with prior art VCSEL devices and production methods by providing an active region having a quantum well structure that can be used in lasers grown on GaAs substrates providing an emission wavelength of 1.0 to 1.6 μm. Such an active region makes use of the combination of strain-compensating barriers with different band alignments in the quantum wells to achieve a long emission wavelength while at the same time minimizing the strain in the structure. The invention provides for structures formed by fabrication of multicomponent alloy layers with a large number of constituents. The alloy is tailored so that each of these constituents contributes both to the accumulated strain and to a longer emission/absorption wavelength. Devices made in accordance with the present invention may have utility for both or either of emission and absorption of light, or for light modulation, and may further be by virtue of their physical and optical party adapted particularly for successful or optimal emission and/or absorption of light having particular wavelength. In this connection, one may usefully refer to and characterize a device by reference to a wavelength at which it can efficiently process, i.e. absorb and/or emit, light. The alloy composition for the quantum well layers is optimized so that the longest possible wavelength is achieved with the minimum total strain. Additional strain-compensation barrier layers help to reduce the total strain of the structure further, thereby minimizing the possible formation of dislocation and other defects that adversely affect device performance and device lifetime. The most significant constituent in the layer-forming alloys described herein is nitrogen (N), which leads to a reduction of the bandgap energy (longer wavelength), while at the same time reducing the lattice constant, thereby reducing the strain. Phosphorus (P) also has this property, while antimony (Sb) and indium (In) lead to larger lattice constants and therefore cause compressive stain in layers grown on GaAs. The incorporation of N at levels higher than a few percent is challenging and potentially leads to poor crystal quality. In combination with the other alloy constituents, however, it can be used in amounts that are easy to handle from a technological point of view, while contributing a significant additional amount to the maximum achievable wavelength.

The active layer structures set forth in the claimed invention herein are combinations of the basic building blocks as described below and all rely on quantum confinement. For quantum confinement, layers need to be combined in which the energies of the valence and conduction bands differ from one layer to another. The simplest such structure, a quantum well, is shown in FIG. 4. A layer with a lower conduction band edge and a higher valence band edge—holes have an inverted energy scale—is sandwiched between layers where the conduction band edge is higher and the valence band edge is lower. The charge carriers, electrons in the conduction band and holes in the valence band, become trapped in this structure in quantized levels and recombine very efficiently, emitting light with a wavelength corresponding to the distance between the lowest conduction band level and the highest valence band level. Operating the device as a detector, such a quantum well has a very high absorption and therefore a good detectivity. As noted before, a device having such a structure may have light-processing utility either as a light emitter or a light receptor/detector, or a light modulator, or any or all of these from time to time depending on intended use.

To increase the efficiency of a quantum-well containing structure, several quantum wells can be stacked in periodic order, as shown in FIG. 5. In the case where the quantum wells are closely coupled, such an arrangement is called a superlattice and has its own band structure along the periodic direction, forming an artificially layered material with unique properties. In the case in which the quantum wells are weakly coupled, the energy levels of the quantum well are preserved so that the multi quantum well band structure is simply a multiple of each quantum well.

To reduce further the transition energy, two quantum well layers with different positions of the valence and conduction band edges can be directly combined, as shown in FIG. 6. Such a type-II quantum well has spatially separated regions to trap the electrons and the holes, leading to a transition between the lowest level in the deepest electron well to the highest level in the highest hole well. The advantage of a lower transition energy is usually coupled with a decreasing transition efficiency, since the wave functions for the electrons and the holes are spatially separated and their overlap is reduced. The exact value of this overlap depends very much on the details of the band structure, and configurations have been demonstrated that show a very high efficiency similar to the above (type-I) spatially direct quantum wells.

One way of improving the wave function overlap is the symmetric type-II coupled wells shown in FIG. 7, in which a triple-layer structure is formed so that the barrier between the two electron (hole) wells is relatively low. In this case, the electron (hole) wavefunction has a high value at the symmetry axis of the structure, where the hole (electron) wavefunction peaks. This results in a high efficiency of the transition and therefore a good performance of the device.

Typically, the quantum well layers of the structures demonstrated here have a lattice constant larger than that of the substrate. To reduce the total accumulated strain in the structures that can lead to defects detrimental to the device performance, the barrier layers on both sides of the quantum well layers may be made of a material with a smaller lattice constant than the substrate value. Whereas the layers are then strained with respect to each other, the average strain of the whole structure is reduced or even vanishes. This design principle is called strain balancing and is illustrated in FIG. 8.

In order to overcome the problems encountered by prior art VCSEL devices and manufacturing methods the present invention discloses the use of strain-compensated structures with type-I and type-II band edge alignments. The usage of strain compensation allows multiple layers to be grown with no degradation of the material quality and therefore offers a higher degree of freedom in the device design.

DETAILED DESCRIPTION OF THE PREFERRED EMBODIMENTS

Through the use of strained $In_wGa_{1-w}N_xP_yAs_zSb_{1-x-y-z}$/$Al_pGa_{1-p}As$/GaAs heterostructures, the present invention's material system comprises: 1) Compressively strained $In_wGa_{1-w}N_xP_yAs_zSb_{1-x-y-z}$ quantum wells and tensile strained $Al_qGa_{1-q}N_rP_sAs_{1-r-s}$ barrier layers with a type-I band alignment; and 2) Compressively strained quantum wells utilizing multiple $In_wGa_{1-w}N_xP_yAs_zSb_{1-x-y-z}$/$In_aGa_{1-a}N_bAs_{1-b}$ layers with a type-II band alignment and tensile strained $Al_qGa_{1-q}N_rP_sAs_{1-r-s}$ barrier layers. Both material systems are grown pseudomorphically on GaAs substrates. As used herein, "pseudomorphic" shall mean having a sufficiently low density of misfit dislocations allowing for the production of lasers having sufficiently long lifetimes. Both type-I and type-II band-edge alignments are utilized in the present invention.

Light emission or absorption at wavelengths 1.0 μm to 1.6 μm are achieved by the present invention by using single or multiple combinations of active materials grown on material A, with strain compensation material B, with type-I active material C, or with type-II active materials C and D.

For the type-I active layers:
material system 1=A-B-(C-B)[n times]-A, n=1,2,3, . . .
For the type-II active layers,:
material system 2=A-B-(C-D-B)[n times]-A, n=1,2,3, . . .
material system 3=A-B-(D-C-B)[n times]-A, n=1,2,3, . . .
material system 4=A-B-(D-C-D-B)[n times]-A, n=1,2,3, . . .
material system 5=A-B-(C-D-C-B)[n times]-A, n=1,2,3, . . .
Where the individual layers are:
A=$Al_pGa_{1-p}As$, $0 \leq p \leq 1$
B=$Al_qGa_{1-q}N_rP_sAs_{1-r-s}$, $0 \leq q \leq 1$; $0 \leq r \leq 0.1$; $0 \leq s \leq 1$
C=$In_wGa_{1-w}N_xP_yAs_zSb_{1-x-y-z}$, $0 \leq w \leq 1$; $0 \leq y \leq 0.6$; $0 < z < 1$
D=$In_aGa_{1-a}N_bAs_{1-b}$, $0 \leq a \leq 1$; $0 < b < 0.1$ The quantum wells—layers C and D—are compressively strained, while tensile strain in the spacer barrier—layer B is used to compensate fully or partially the overall strain in the active region. The degree of strain compensation affects the total thickness and the number of quantum wells that can be grown without dislocations. In most embodiments of these multilayer material systems, each layer will lie essentially parallel to the other layers as a result of the layers being built one atop the other.

Figure 1:
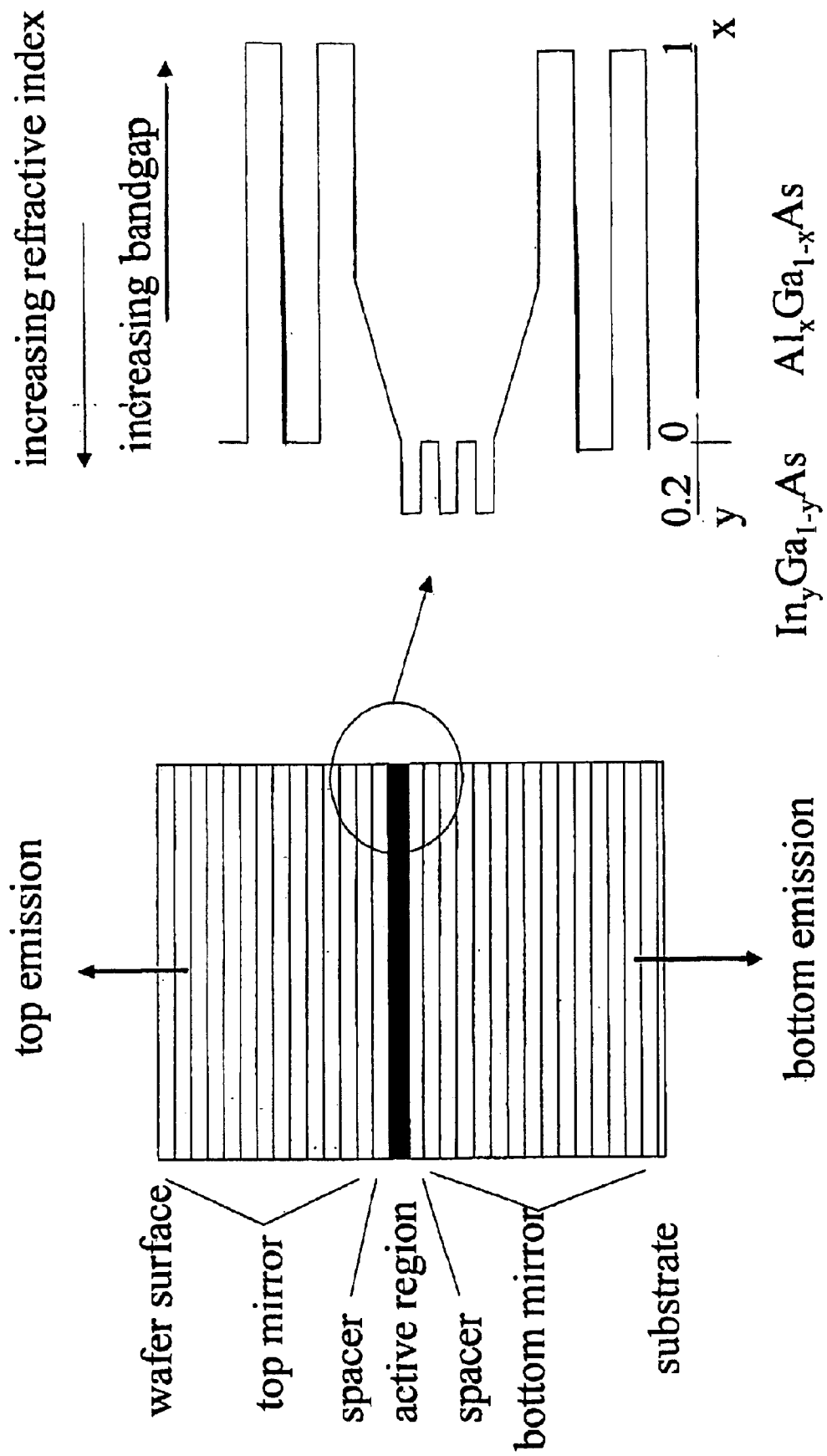
FIG. 1 sets forth a schematic design of a generic VCSEL structure with the variation of the conduction band energy/refractive index/material composition shown to the right.
Figure 2:
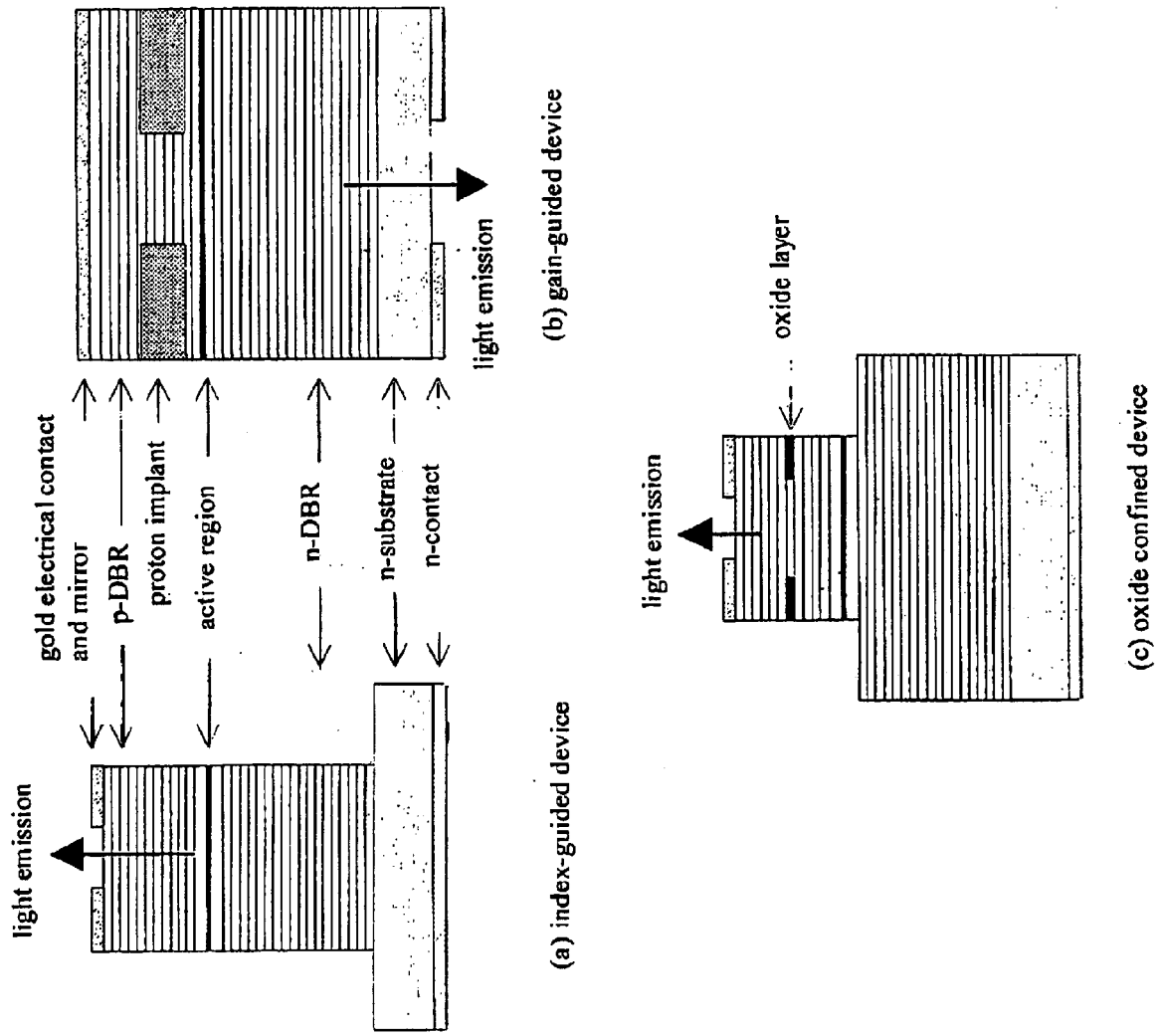
FIG. 2 illustrates a typical VCSEL structure showing (a) index guided device, (b) gain-guided device, (c) oxide confined device.
Figure 3:
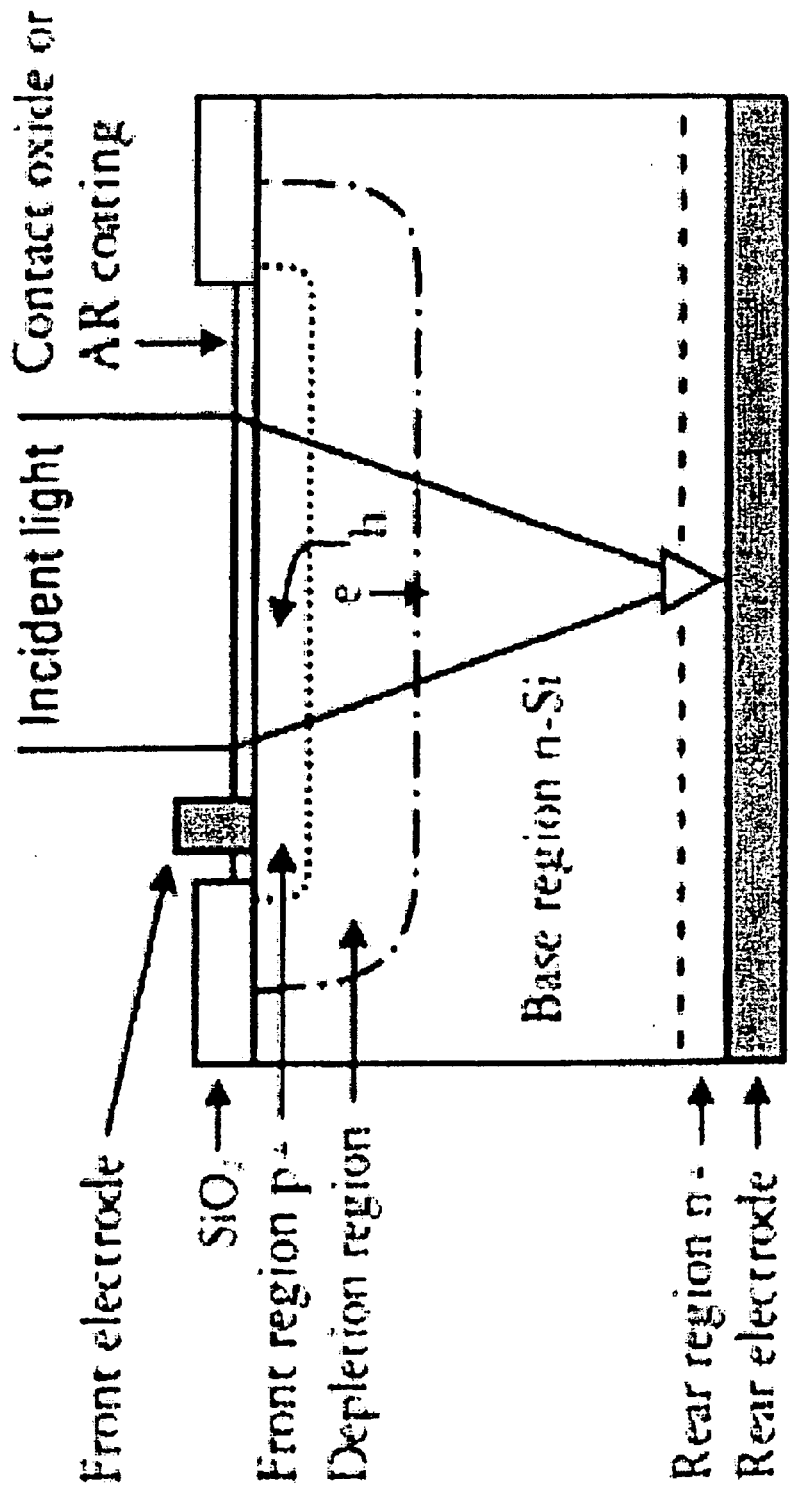
FIG. 3 shows the structure of a generic detector using the same active region materials as the VCSEL.
Figure 4:
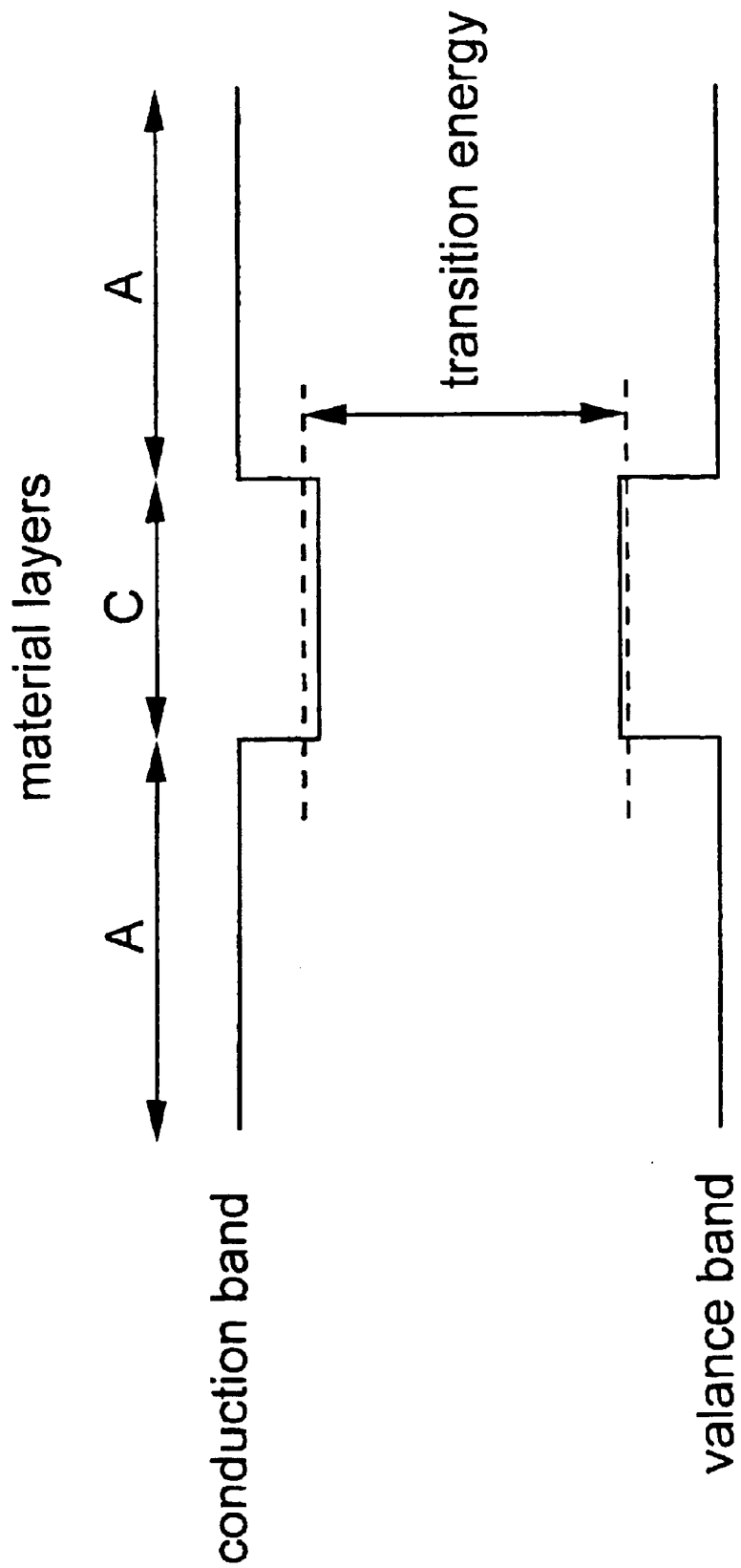
FIG. 4 depicts a type-I quantum well.
Figure 5:
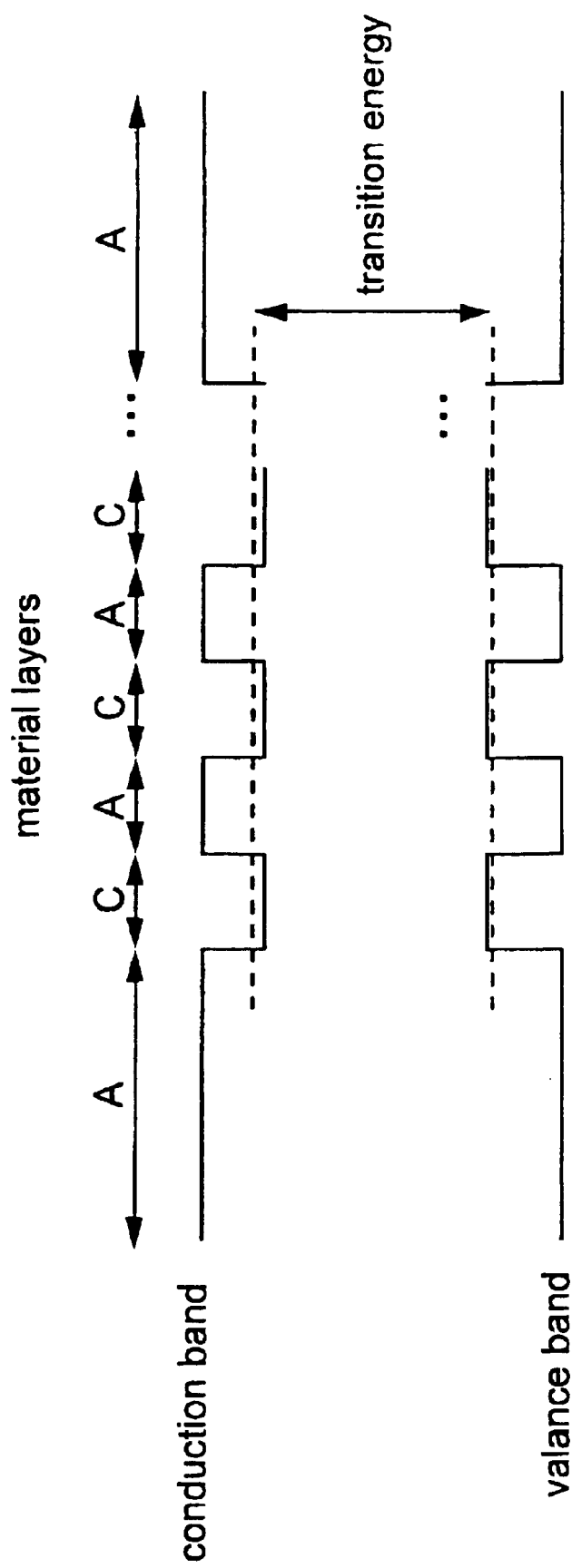
FIG. 5 shows a type-I multi quantum well.
Figure 6:
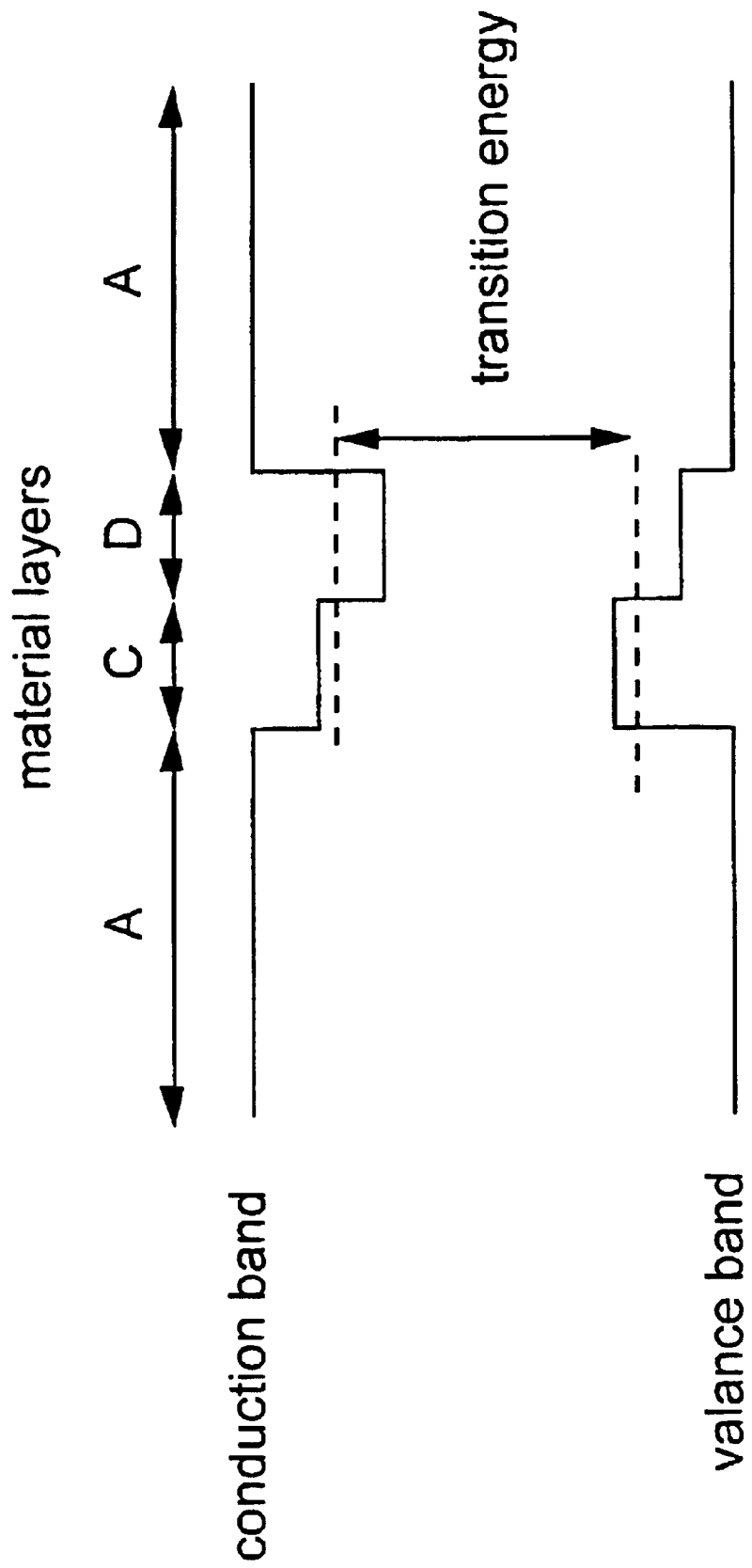
FIG. 6 shows a type-II quantum well.
Figure 7:
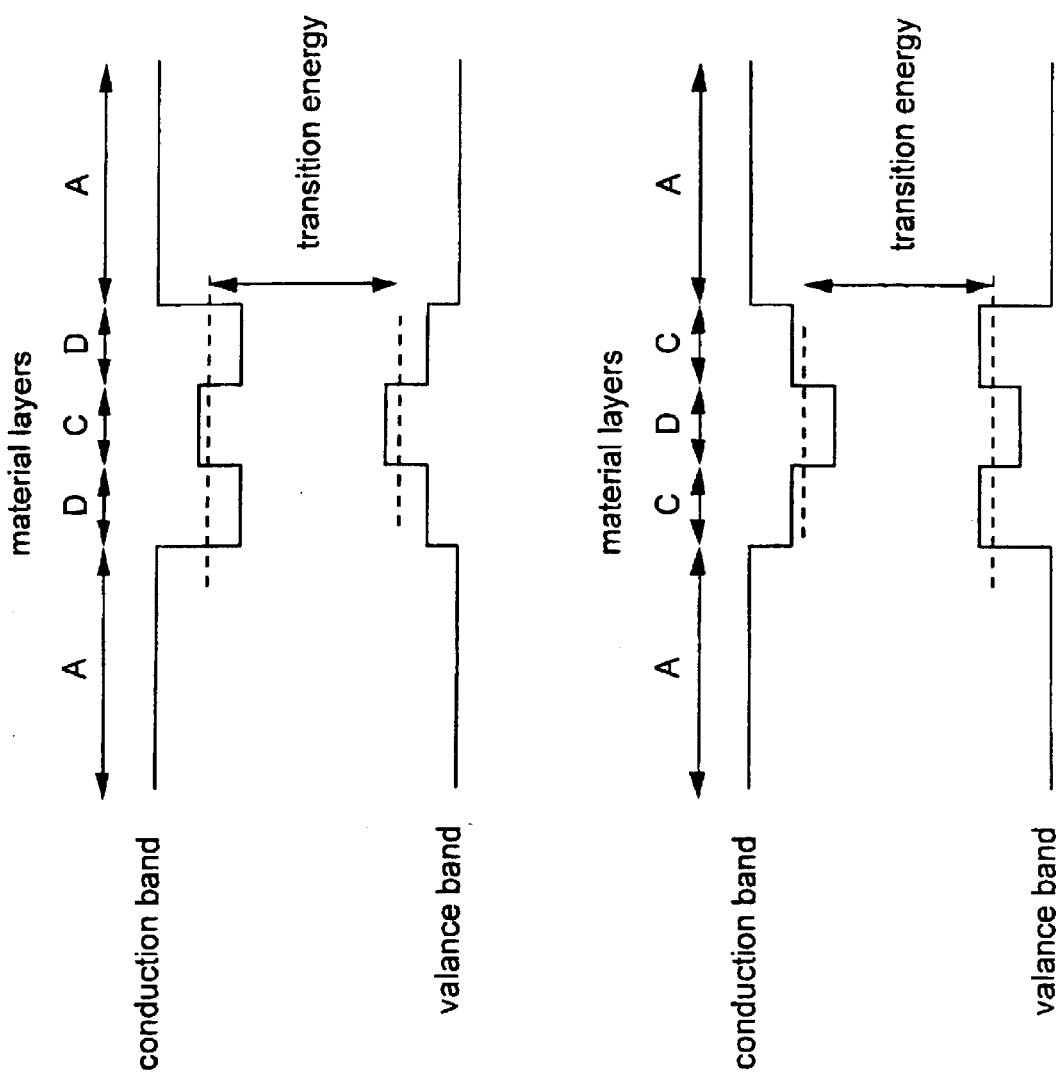
FIG. 7 shows a type-II symmetric quantum well.
Figure 8:
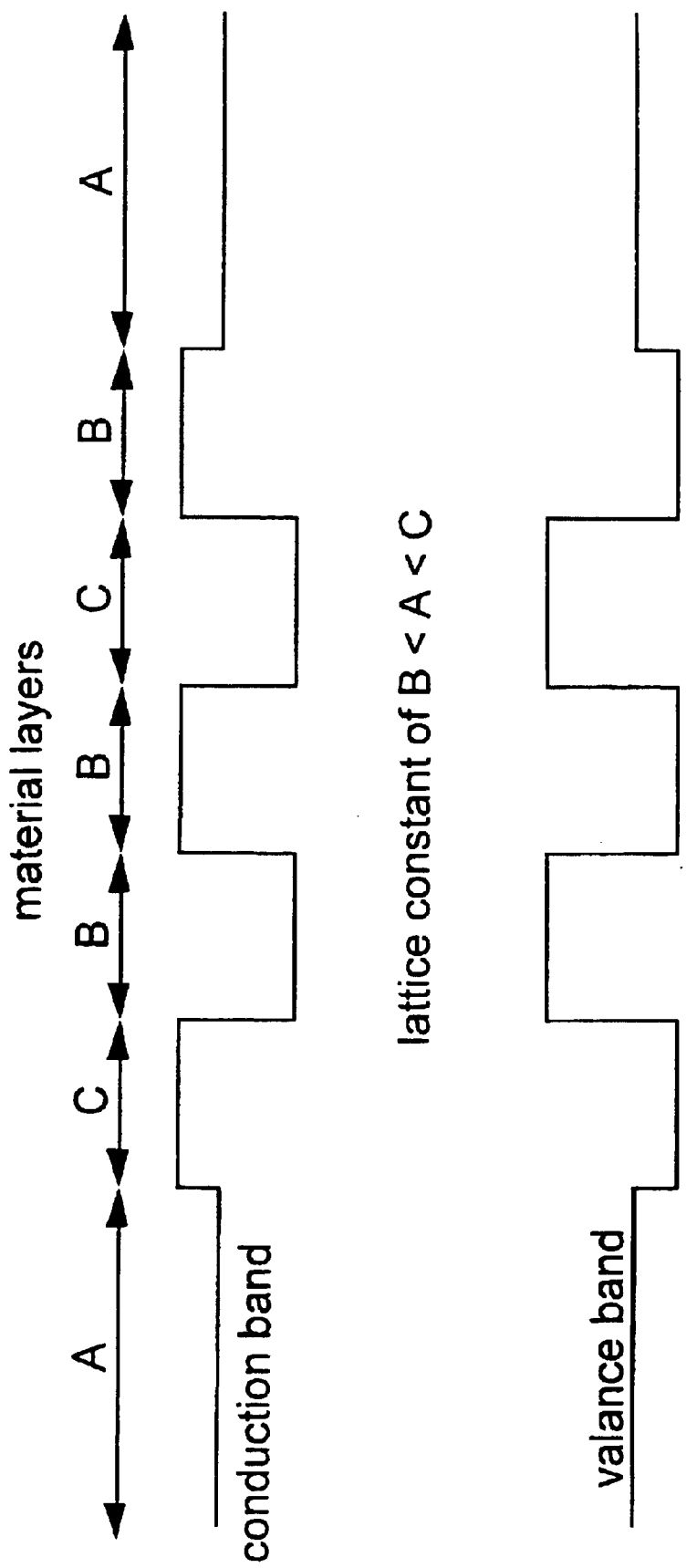
FIG. 8 illustrates the principle of strain compensation.
Figure 9:
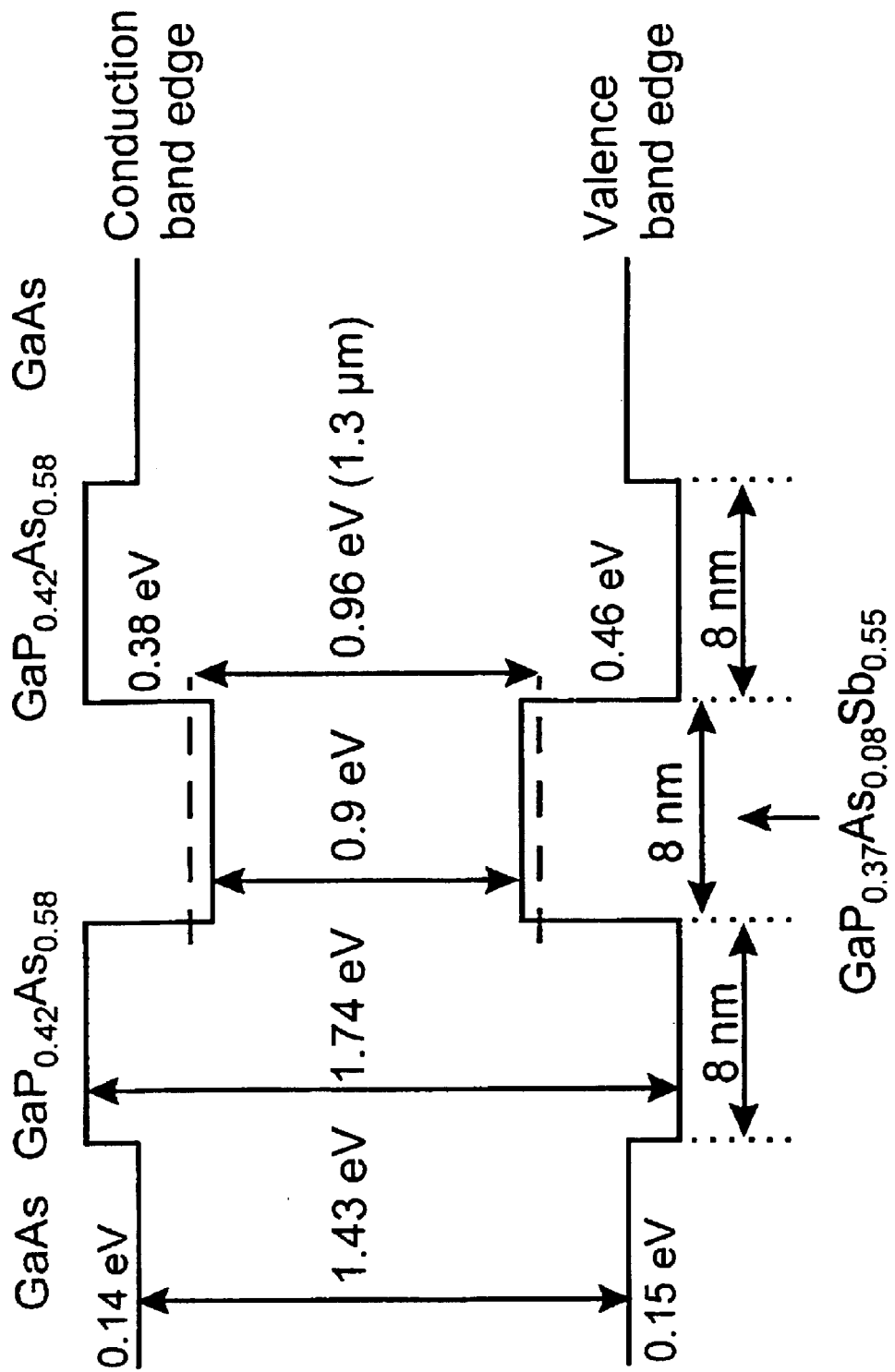
FIG. 9 shows band-edge alignment diagram of a type-I strain compensated QW system designed for emission near 1.3 $\mu$m.

Using the model-solid theory, the band edge diagram of the structures disclosed by the present invention may be constructed as a function of the material composition. As one illustrative embodiment, FIG. 9 shows the conduction band and valence band edge alignments for a particular material system made in accordance with the present invention. The composition of the barriers is $GaP_{0.42}As_{0.58}$ and the composition of the well is $GaP_{0.37}As_{0.08}Sb_{0.55}$. The room-temperature bandgaps of these materials, together with the band discontinuities at the interfaces are also shown. The strain of the barrier layer is +1.5% (tensile), while for the well layer it is −3% (compressive). For the barrier and well compositions given above, the transition energy between the confined electrons and holes within the QW has been calculated as being 0.96 eV for barrier and well widths of 8 nm. This result corresponds to a wavelength close to 1.3 μm, thus demonstrating the ability of the present invention to operate in the desired wavelength range.

To demonstrate experimentally the feasibility of these structures, test samples have been grown by molecular beam epitaxy (MBE) using a chamber equipped with valved cracking cells allowing for precise layer composition control via digital alloying. Through the combination of digital alloying and the use of mixed group V elements, it is possible to practically achieve a layer stoichiometry providing the desired wavelength characteristics (e.g. $\geq 1.3$ μm).

Surprisingly, it has been found in connection with the present invention that the inclusion of P and Sb can result in VCSELs having wavelengths $\geq 1.3$ μm with sufficiently longer lifetime than conventionally-known devices. This result goes counter to approaches commonly taken by those ordinarily skilled in the art. Generally, it has been believed that the inclusion of P and Sb will result in material with an indirect bandgap, particularly in the case where there is little or no In in the QW. Consequently, such material is believed to have been largely or entirely overlooked as an element for telecommunications wavelength devices. Additionally, the effects of strain and composition on direct and indirect bandgaps are not well established. It has been found in connection with the present invention that the inclusion of P and N reduces the material strain, hence the critical thickness becomes larger. This makes it easier to grow high quality pseudomorphic (defect-free) layers of the material, before surface roughening/corrugation occurs. The use of this material provides a new parameter space, allowing for improved strain-compensating layers so as to produce high quality epitaxial material. Through the use of the methods and materials disclosed by the present invention, the composition of the QW can also be chosen so that the active material has a direct band-to-band energy transition corresponding to a wavelength in the vicinity of 1.3 μm.

Figure 10:
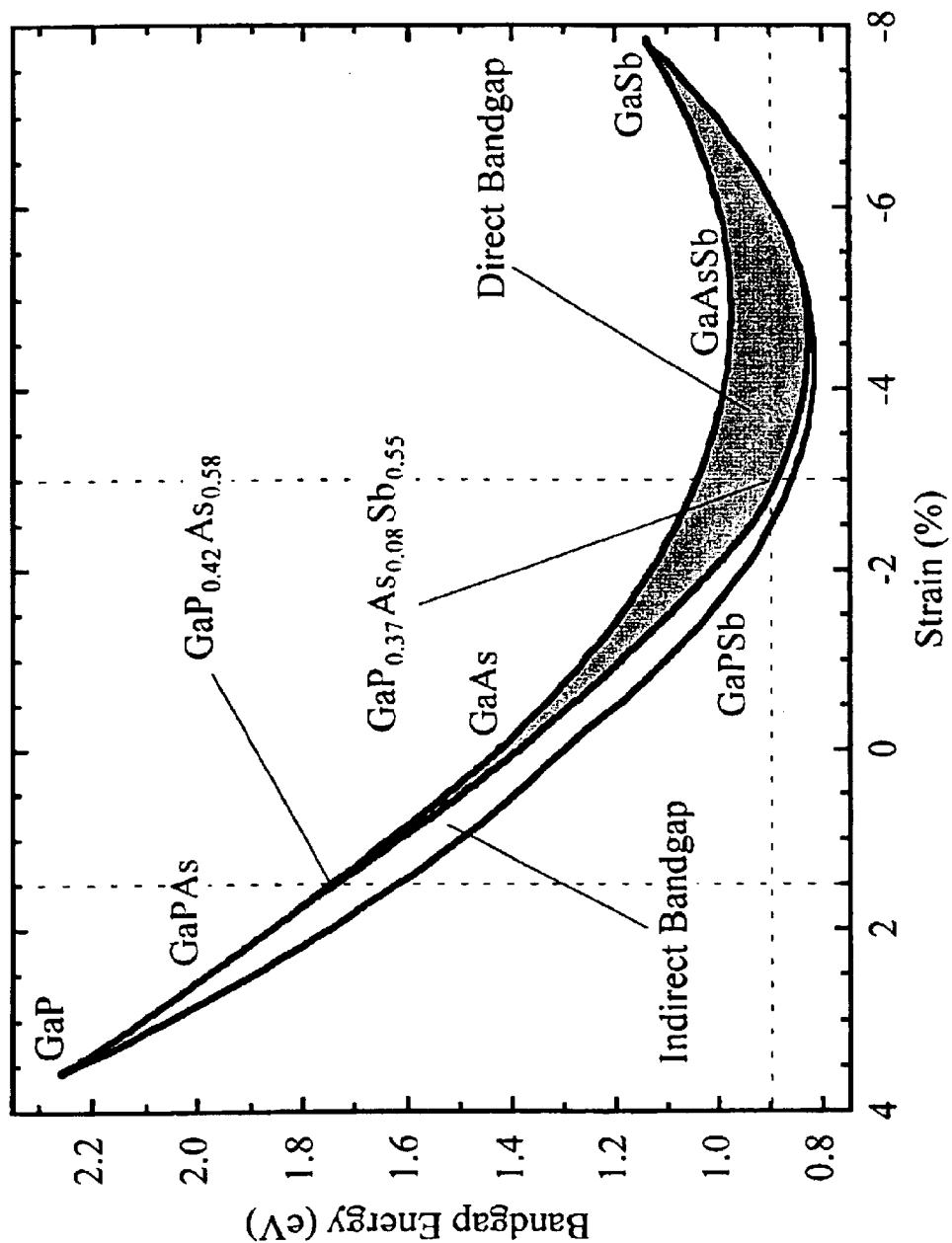
FIG. 10 compares point bandgap energy versus strain for coherently strained GaPAsSb on GaAs. Negative strain values indicate compressive strain. The right-hand shaded region is direct bandgap material while the left-hand shaded region is indirect bandgap material.

It is the large bandgap bowing parameter of GaPSb that facilitates emission wavelengths up to and beyond 1.3 μm the (In)GaNPAsSb material system. However, pseudomorphic GaPSb on GaAs is an indirect bandgap material for compressive strain levels below −5% and hence is not suitable as an active material for lasers. To obtain a 0.96 eV (1.3 μm) direct bandgap material at strain levels less than −5%; small amounts of As or InAs must be added to GaPSb. As an example, the bandgap energy versus strain for GaPAsSb is shown in FIG. 10. In FIG. 10, the ternaries GaPAs, GaPSb, and GaAsSb ternaries border the GaPAsSb quaternary region.

For the region labeled "direct bandgap" (in FIG. 10) the lowest energy band to band transition is between the Γ point of the conduction band and the Γ point of the valence band; these compositions are suitable as active materials for lasers. For the region labeled indirect bandgap, the lowest energy band to band transition is an indirect transition that occurs between either the X or the L valley of the conduction band and the Γ point of the valence band; these compositions are not suitable as active materials for lasers. The bandgap energy values shown in FIG. 10 are calculated at the Γ point.

The X, L, and Γ band structure notations refer to separate electron or crystal momentum values. The term direct transition refers to the movement of an electron between energy states with the same momentum (i.e., Γ point to Γ point), while the term "indirect transition" refers to a change in both momentum and energy during the transition. Indirect bandgap materials are not suitable as active materials for lasers because the optical band-to-band transitions require the mediation of an additional particle in order to conserve momentum; this greatly reduces the probability of the optical transition occurring.

Because GaP has a large bandgap (>2 eV) and an indirect bandgap, it is not obvious that the (In)Ga(N)PAsSb material system is suitable for long wavelength GaAs-based lasers.

The non-obvious attributes of the (In)Ga(N)PAsSb material system that make it suitable for GaAs-based lasers include, but are not limited to:

1) The large bowing bandgap parameter of GaPSb; see FIG. 10, where the bandgap of the intermediate GaPSb ternary is smaller than that of either binary end point (GaP or GaSb).

2) The large range of mixed group-V (P, As, and Sb) compositions where GaPAsSb is a direct bandgap material.

The addition of N and In to these alloys leads to a further reduction in the bandgap energies and therefore longer operating wavelengths. N seems to incorporate as a localized state, causing a strong interaction between this narrow resonant band and the conduction band, thereby reducing the fundamental band gap of the direct transition. It has been demonstrated that active layers incorporating N can lase in a VCSEL device with a drastic shift to longer wavelengths as compared to the N-free alloy for only very small percentages N. Since larger amounts of N are difficult to incorporate, for example in InGaAs, it is a challenging task to reach even 1.3 μm for device applications in these single group V element (As) systems. Generally, the layers need to be grown at a low growth temperature and annealed afterwards, which results in a high defect density and structural changes in the alloy, as is evident from a shift in the emission or absorption wavelength. The claimed invention avoids these difficulties by combining N incorporation with the structures discussed above, leading to a significant additional shift in the wavelength while keeping the strain and the defect density low. The increase of the Sb fraction instead of In with N in these alloys leads to a better N incorporation and therefore a better layer quality, since Sb is a better match in terms of growth temperature and sticking coefficient, especially towards the metal-stable growth regime.

One embodiment of the present invention, denoted herein as system 1, consists of an active layer of layer sequence that may be A-B-C-B-A on a substrate close in composition to GaAs, i.e., comprising GaAs and/or its structural and functional equivlaent in substantial proportion; where $A=Al_pGa_{1-p}As$, $0 \leq p \leq 1$;
$B=Al_qGa_{1-q}N_rP_sA_{1-r-s}$, $0 \leq q1$; $0 \leq r \leq 0.1$; $0 \leq s \leq 1$;
$C=In_wGa_{1-w}N_xP_yAs_zSb_{1-x-y-z}$, $0 \leq w \leq 1$; $0 < x < 0.1$; $0 \leq y \leq 0.6$; $0 < z < 1$.

Figure 11:
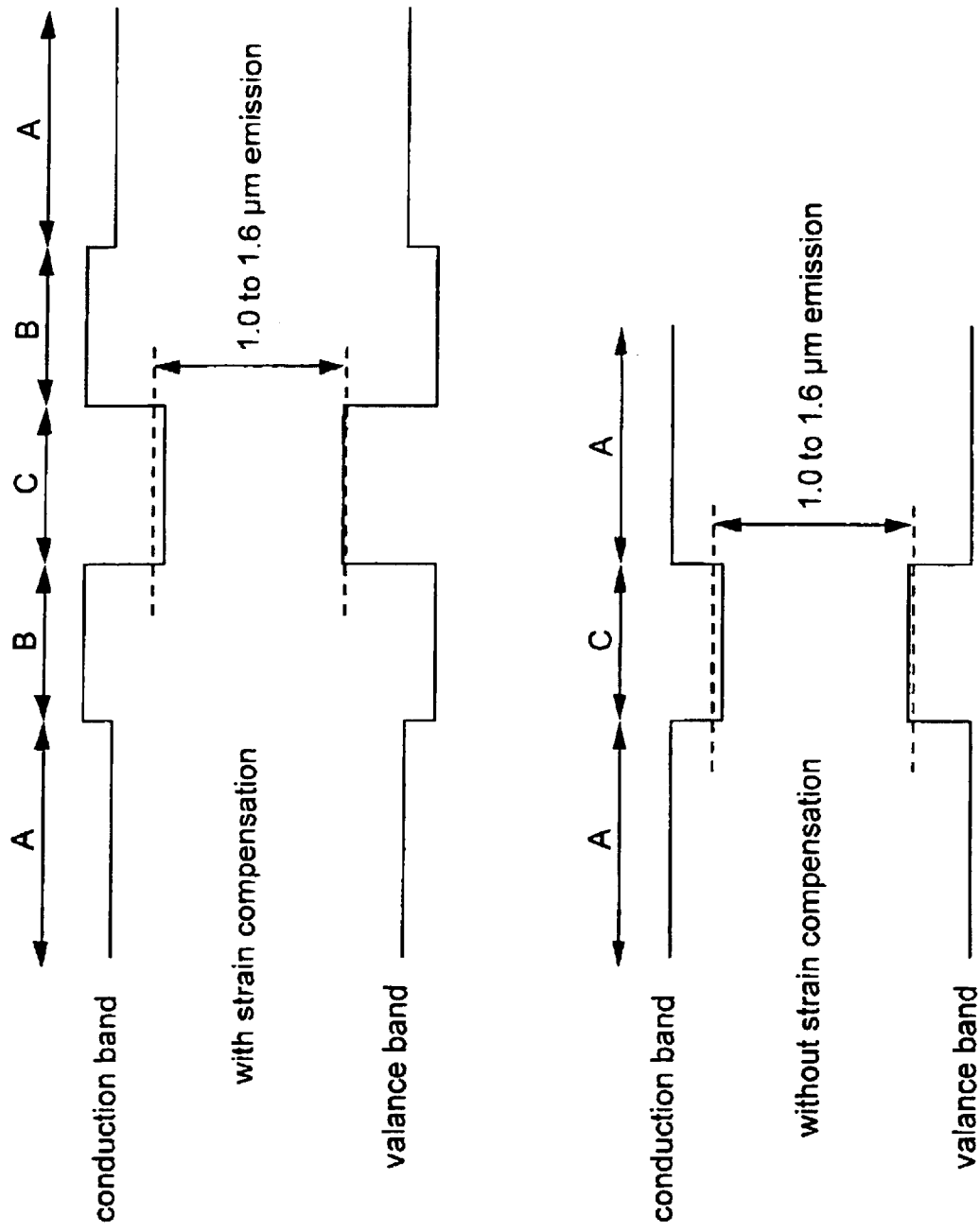
FIG. 11 illustrates an A/B/C/B/A type-I single quantum well utilizing material system 1 in accordance with the present invention.

For purposes of notational clarity, it will be understood that the conceptual layer sequence designation A-B-C-B-A (as just described, for example) characterizes sequentially-stacked layers, each layer being adjacent to the next-denoted layer (again following the just-described example, a layer of composition A adjacent to a layer of composition B, itself adjacent on an opposite side to a layer of composition C, in turn adjacent on its opposite side to a layer of composition B, which is finally adjacent on its opposite side to a layer of composition A). The schematic band structure of this layer sequence is shown in FIG. 11. For r=s=0 in layer B, the strain compensation may also be zero.

Figure 12:
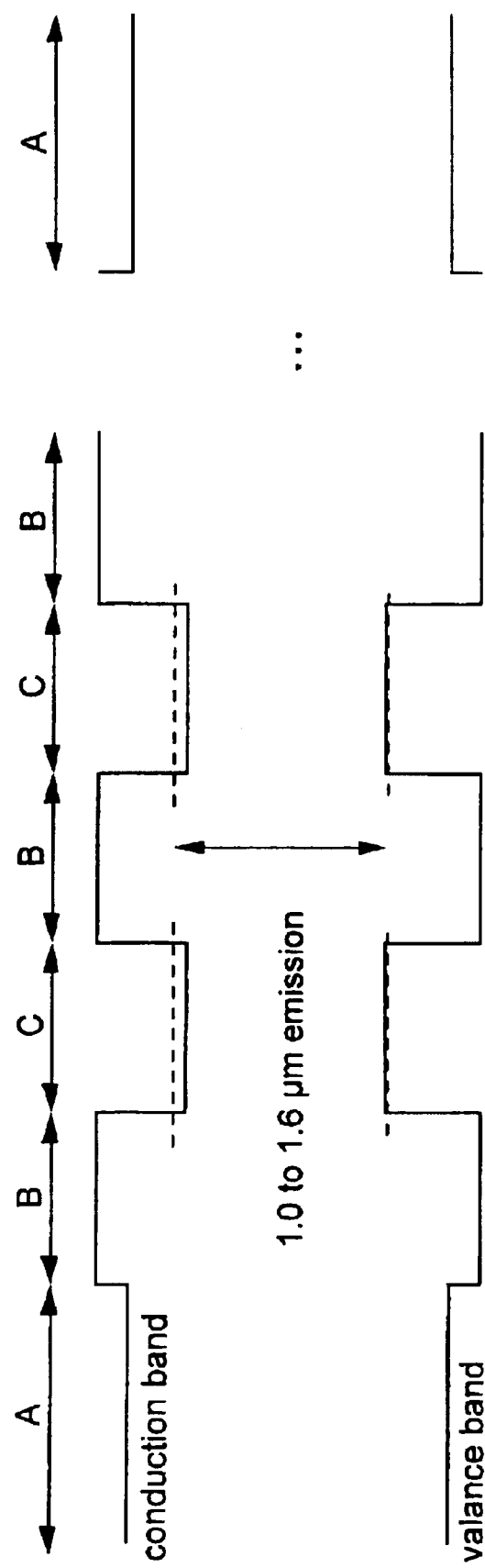
FIG. 12 illustrates A/B/C/B/A type-I multi quantum wells utilizing material system 1 in accordance with the present invention.

In another embodiment of the invention, the C-B unit of the active layer may be repeated, leading to the structure shown schematically in FIG. 12. For r=s=0 in the layers B, the strain compensation may also be substantially zero.

One embodiment of the invention, denoted herein as system 2, consists of an active layer of layer sequence A-B-C-D-B-A on a substrate close in composition to GaAs; where $A=Al_pGa_{1-p}As$, $0 \leq p \leq 1$;
$B=Al_qGa_{1-q}N_rP_sAs_{1-r-s}$, $0 \leq q \leq 1$; $0 \leq r \leq 0.1$; $0 \leq s \leq 1$;
$C=In_wGa_{1-w}N_xP_yAs_zSb_{1-x-y-z}$, $0 \leq w \leq 1$; $0 < x < 0.1$; $0 \leq y \leq 0.6$; $0 < z < 1$;
$D=In_aGa_{1-a}N_bAs_{1-b}$, $0 \leq a \leq 1$; $0 < b < 0.1$.

Figure 13:
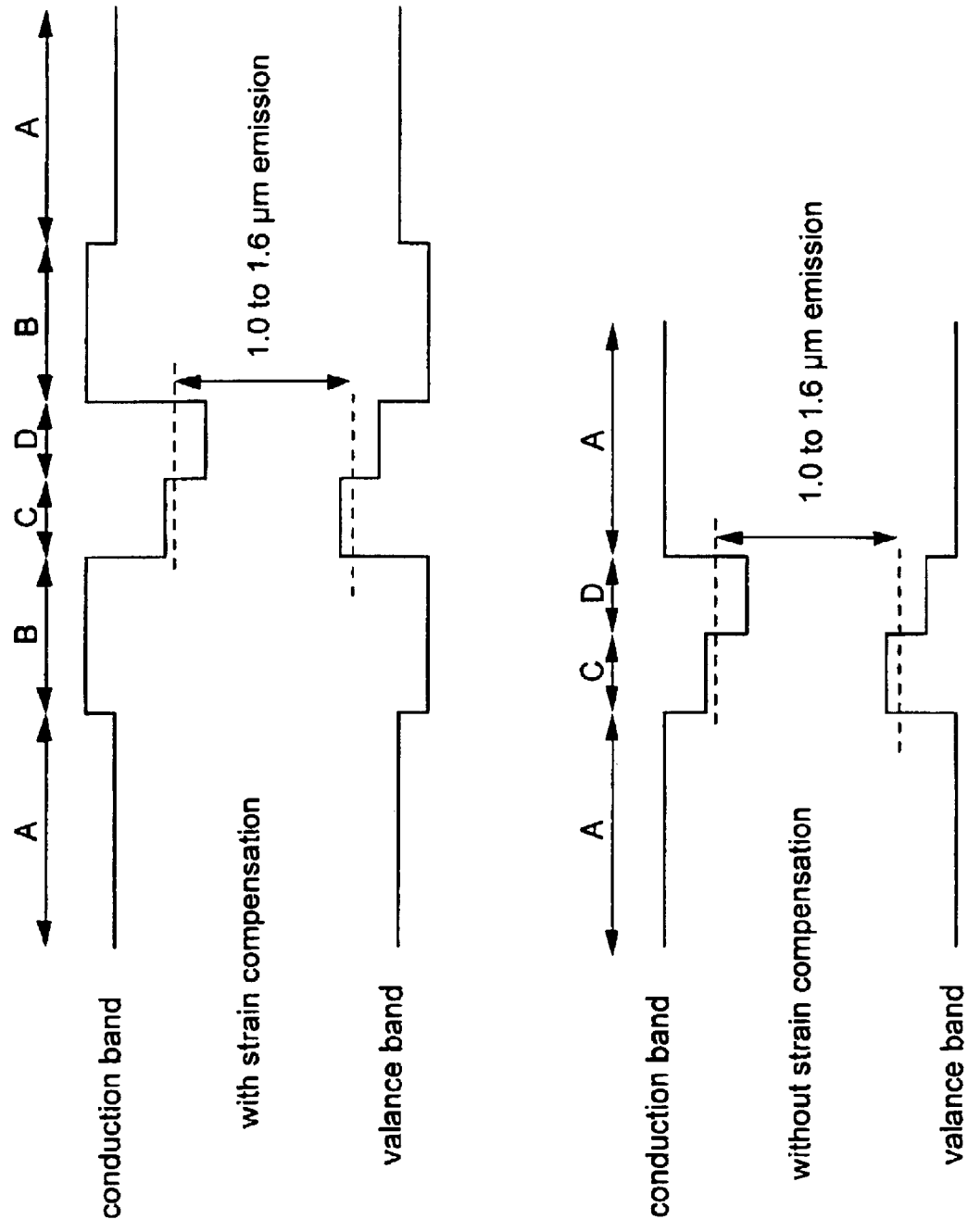
FIG. 13 illustrates an A/B/C/D/B/A type-II single quantum well utilizing material system 2 in accordance with the present invention.

The schematic band structure of this layer sequence is shown in FIG. 13. For r=s=0 in layer B, the strain compensation may also be substantially zero.

Figure 14:
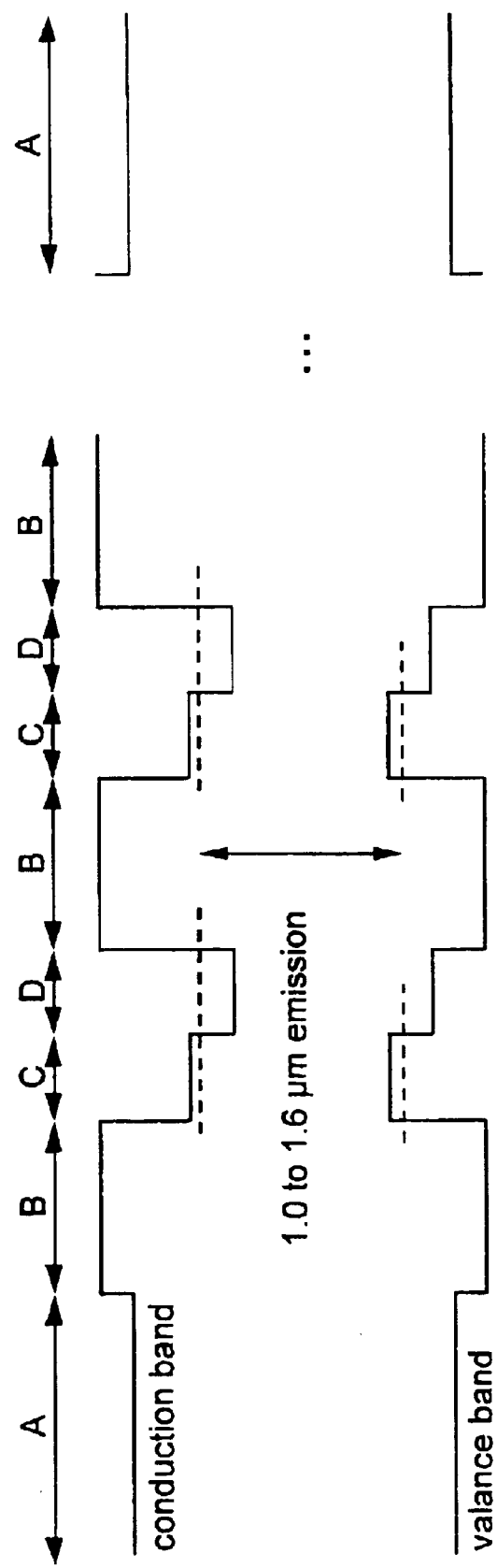
FIG. 14 illustrates A/B/C/D/B/A type-II multi quantum wells utilizing material system 2 in accordance with the present invention.

In another embodiment of the invention, the C-D-B unit of the active layer may be repeated, leading to the structure shown schematically in FIG. 14. For r=s=0 in the layers B. the strain compensation may also be zero.

One embodiment of the invention, denoted herein as system 3, consists of an active layer of layer sequence A-B-D-C-B-A on a substrate close in composition to GaAs; where $A=Al_pGa_{1-p}As$, $0 \leq p \leq 1$;
$B=Al_qGa_{1-q}N_rP_sAs_{1-r-s}$, $0 \leq q \leq 1$; $0 \leq r \leq 0.1$; $0 \leq s \leq 1$;
$C=In_wGa_{1-w}N_xP_yAs_zSb_{1-x-y-z}$, $0 \leq w \leq 1$; $0 < x < 0.1$; $0 \leq y \leq 0.6$; $0 < z < 1$;
$D=In_aGa_{1-a}N_bAs_{1-b}$, $0 \leq a \leq 1$; $0 < b < 0.1$.

Figure 15:
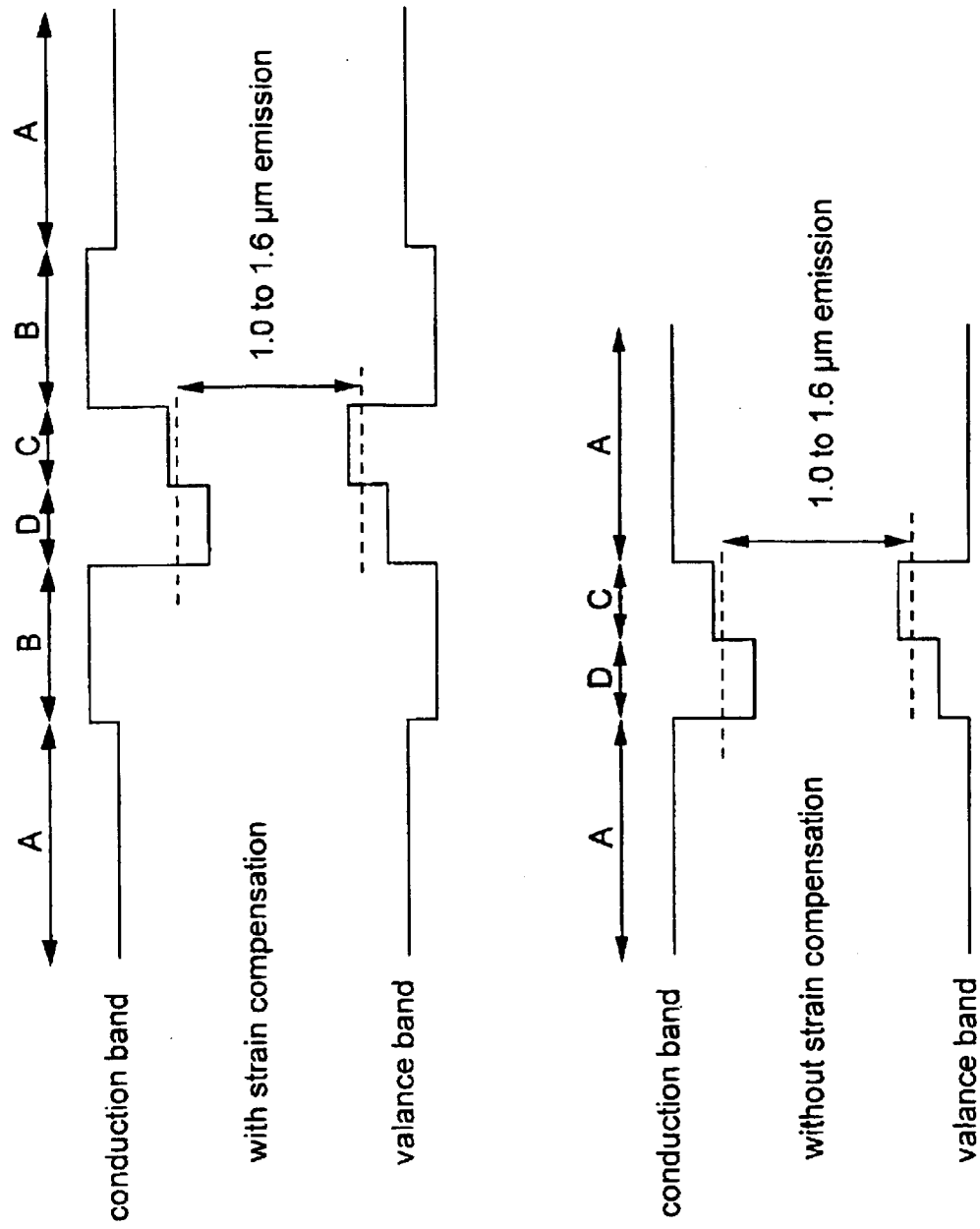
FIG. 15 illustrates an A/B/D/C/B/A type-II single quantum well utilizing material system 3 in accordance with the present invention.

The schematic band structure of this layer sequence is shown in FIG. 15. For r=s=0 in layer B, the strain compensation may also be zero.

Figure 16:
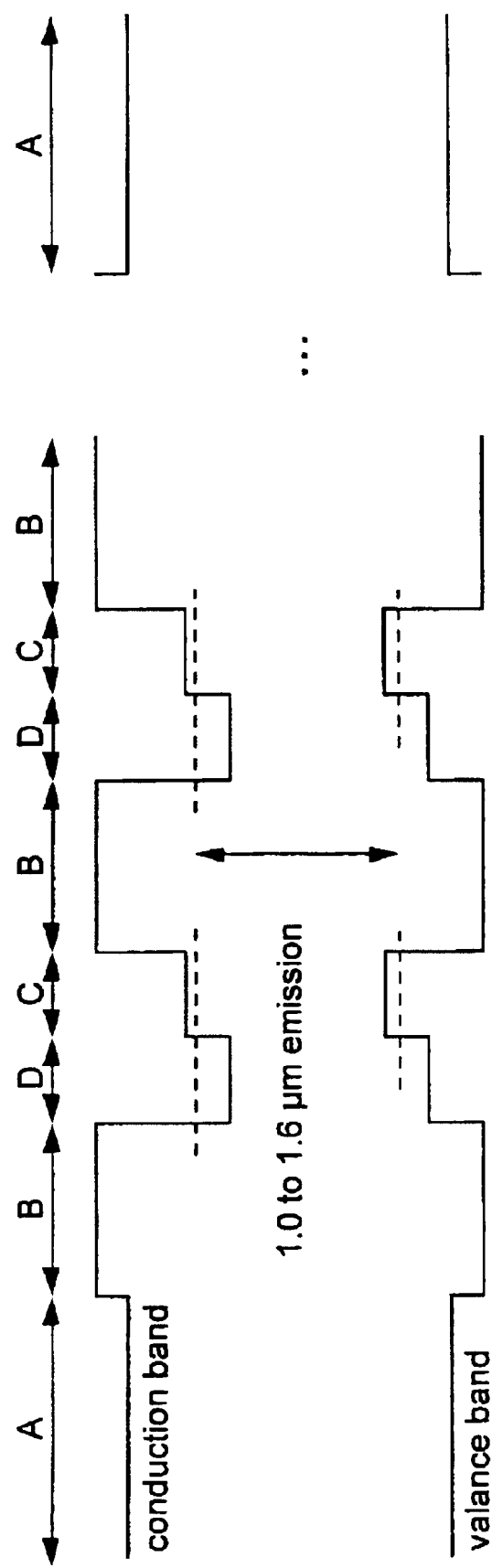
FIG. 16 illustrates A/B/D/C/B/A type-II multi quantum wells utilizing material system 3 in accordance with the present invention.

In another embodiment of the invention, the D-C-B unit of the active layer may be repeated, leading to the structure shown schematically in FIG. 16. For r=s=0 in the layers B, the strain compensation may also be substantially zero.

One embodiment of the invention, denoted herein as system 4, consists of an active layer of layer sequence A-B-D-C-D-B-A on a substrate close in composition to GaAs; where $A=Al_pGa_{1-p}As$, $0 \leq p \leq 1$;
$B=Al_qGa_{1-q}N_rP_sAs_{1-r-s}$, $0 \leq q \leq 1$; $0 \leq r \leq 0.1$; $0 \leq s \leq 1$;
$C=In_wGa_{1-w}N_xP_yAs_zSb_{1-x-y-z}$, $0 \leq w \leq 1$; $0 < x < 0.1$; $0 \leq y \leq 0.6$; $0 < z < 1$;
$D=In_aGa_{1-a}N_bAs_{1-b}$, $0 \leq a \leq 1$; $0 < b < 0.1$.

Figure 17:
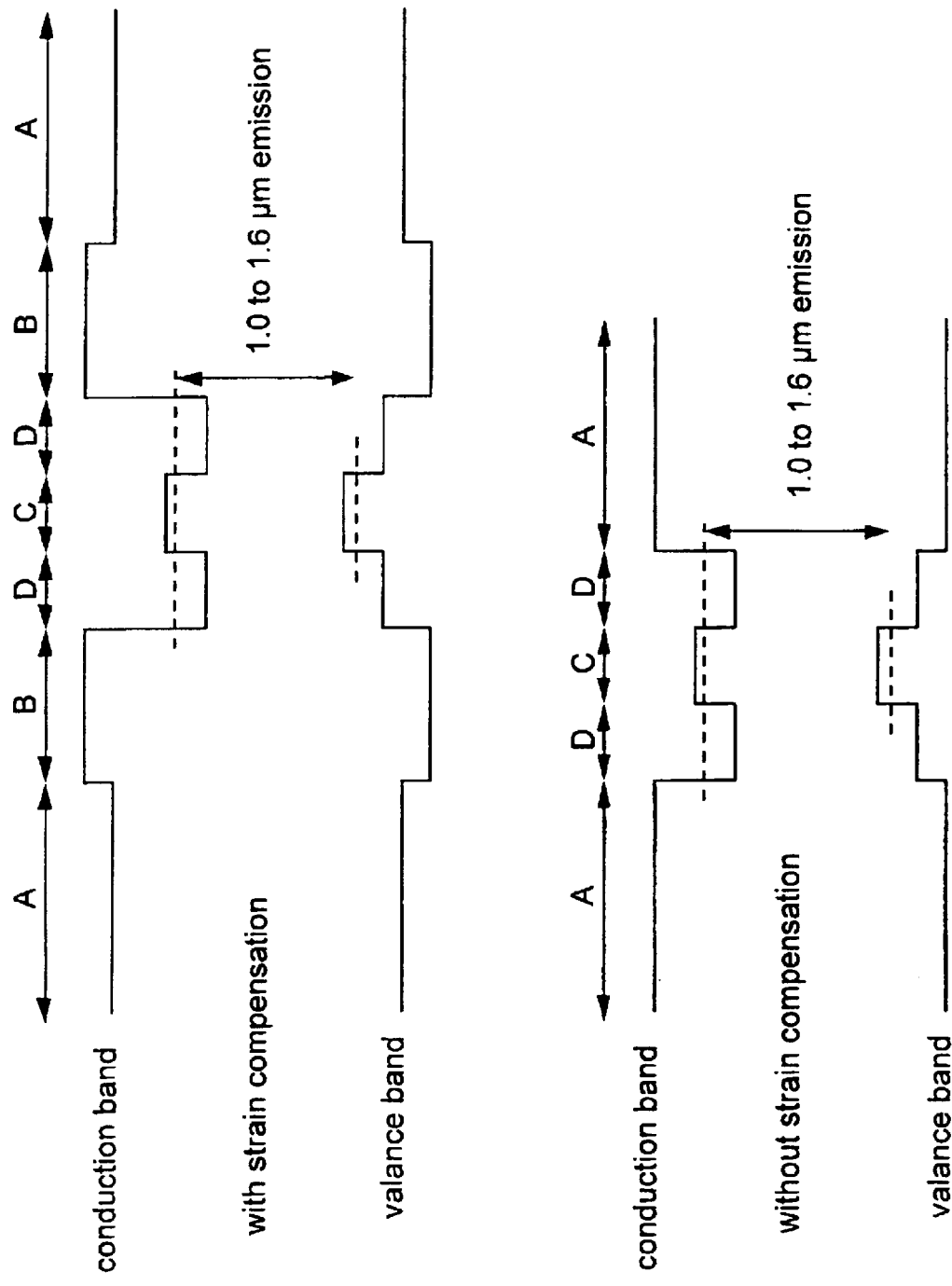
FIG. 17 illustrates an A/B/D/C/D/B/A type-II single quantum well utilizing material system 4 in accordance with the present invention.

The schematic band structure of this layer sequence is shown in FIG. 17. For r=s=0 in layer B, the strain compensation may also be substantially zero.

Figure 18:
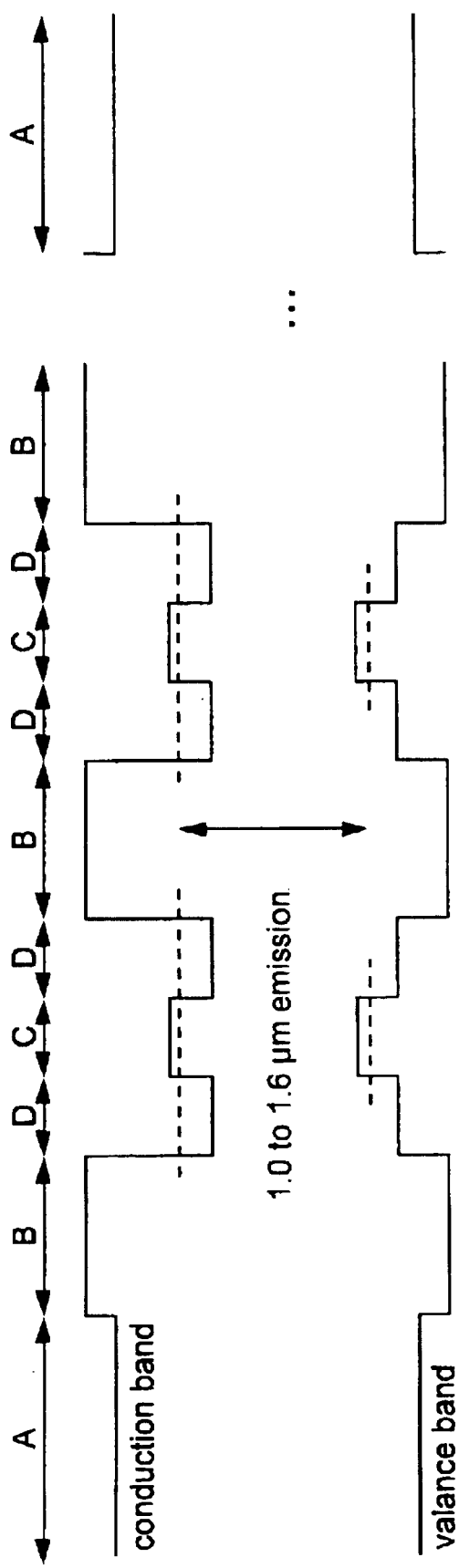
FIG. 18 illustrates A/B/D/C/D/B/A type-II multi quantum wells utilizing material system 4 in accordance with the present invention.

In another embodiment of the present invention, the D-C-D-B unit of the active layer may be repeated, leading to the structure shown schematically in FIG. 18. For r=s=0 in the layers B, the strain compensation may also be substantially zero.

One embodiment of the present invention, denoted system 5, consists of an active layer of layer sequence A-B-C-D-C-B-A on a substrate close in composition to GaAs; where $A=Al_pGa_{1-p}As$, $0 \leq p \leq 1$;
$B=Al_qGa_{1-q}N_rP_sAs_{1-r-s}$, $0 \leq q \leq 1$; $0 \leq r \leq 0.1$; $0 \leq s \leq 1$;
$C=In_wGa_{1-w}N_xP_yAs_zSb_{1-x-y-z}$, $0 \leq w \leq 1$; $0 < x < 0.1$; $0 \leq y \leq 0.6$; $0 < z < 1$;
$D=In_aGa_{1-a}N_bAs_{1-b}$, $0 \leq a \leq 1$; $0 < b < 0.1$.

Figure 19:
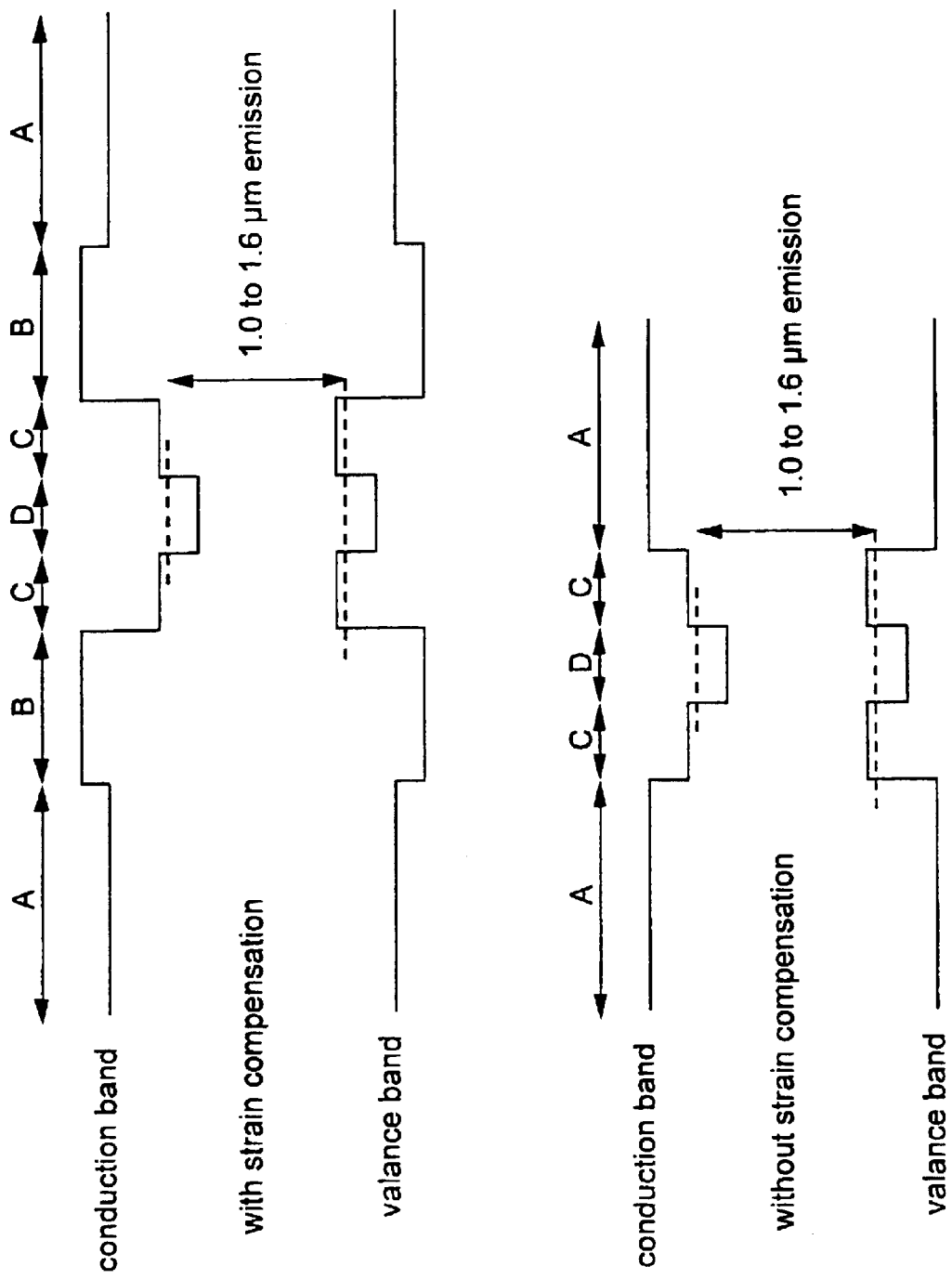
FIG. 19 illustrates an A/B/C/D/C/B/A type-II single quantum well utilizing material system 5 in accordance with the present invention.

The schematic band structure of this layer sequence is shown in FIG. 19. For r=s=0 in layer B, the strain compensation may also be substantially zero.

Figure 20:
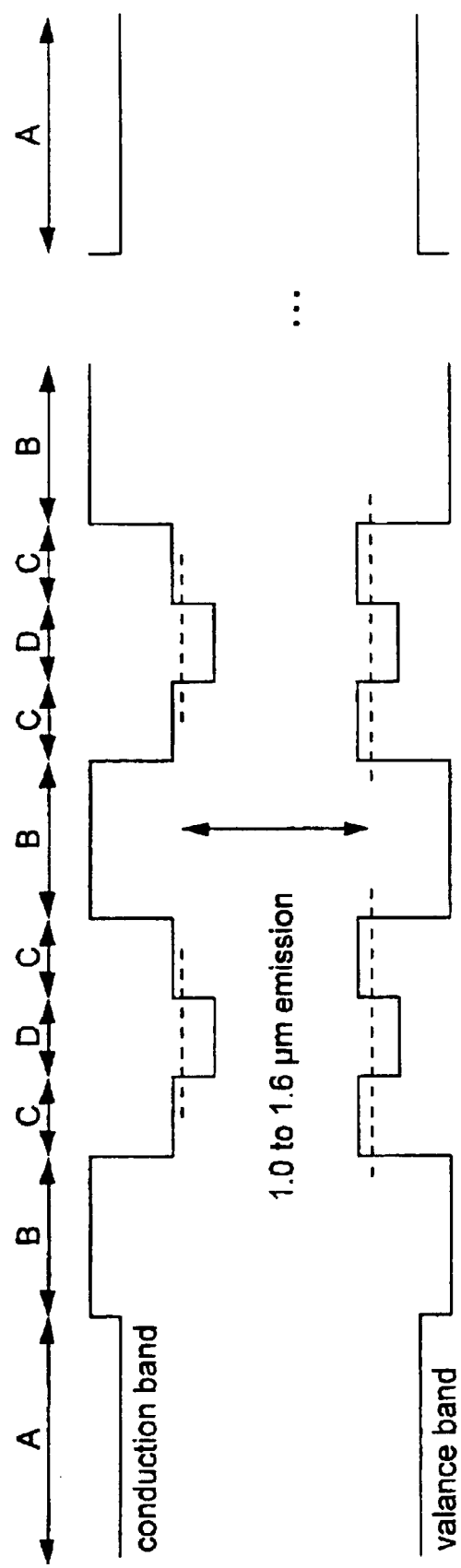
FIG. 20 illustrates A/B/C/D/C/B/A type-II multi quantum wells utilizing material system 5 in accordance with the present invention.

In another embodiment of the present invention, the C-D-C-B unit of the active layer may be repeated, leading to the structure shown schematically in FIG. 20. For r=s=0 in the layers B, the strain compensation may also be substantially zero.

It will be evident to those of ordinary skill in the art that the above-described modes and embodiments of the present invention, while they disclose useful aspects of the present invention and its advantages, are illustrative and exemplary only, and do not describe or delimit the spirit and scope of the present invention, which are limited only by the claims that follow below. All references referred to hereinabove are incorporated by reference herein in full.

We claim as our invention:

1. A light processing device comprising: (a) a substrate and (b) an active region, wherein said substrate comprises a semiconductor material having a lattice constant, and wherein said active region comprises a plurality of layers including: (i) at least one pseudomorphic light processing layer comprising $In_wGa_{1-w}N_xP_yAs_zSb_{1-x-y-z}$ ($0 \leq w \leq 1$, $0<x<0.1$, $0 \leq y \leq 0.6$, $0<z<1$) and; at least one pseudomorphic barrier layer comprising $Al_qGa_{1-q}N_rP_sAs_tSb_{1-r-s-t}$ ($0 \leq q \leq 1$, $0 \leq r \leq 0.1$, $0 \leq s \leq 1$, $0<t<1$) and wherein each of said plurality of layers in said active region has a composition different from the composition of any adjacent layer.

2. The device of claim 1, wherein the light processing device is constructed to form one of: (a) a light emitting device; (b) a light receiving device; (c) a light sensing device; and (d) a light modulating device.

3. The device of claim 1, wherein said active region further comprises at least one pseudomorphic light processing layer comprising $In_aGa_{1-a}N_bAs_{1-b}$ ($0 \leq a \leq 1$, $0<b<0.1$).

4. The device of claim 3, wherein each of said plurality of layers in said active region lies substantially parallel to a common plane.

5. The device of claim 1, wherein said active region comprises a sequence of layers A-B-C-B-A, wherein layer A comprises $Al_pGa_{1-p}As$ ($0 \leq p \leq 1$), layer B comprises $Al_qGa_{1-q}N_rP_sAs_tSb_{1-r-s-t}$ ($0 \leq q \leq 1$, $0<r<0.1$, $0 \leq s \leq 1$, $0<t<1$), and layer C comprises $In_wGa_{1-w}N_xP_yAs_zSb_{1-x-y-z}$ ($0 \leq w \leq 1$, $0<x<0.1$, $0 \leq y \leq 0.6$, $0<z<1$), and wherein the band structure formed between layers B and C has a type-I band-edge alignment.

6. The device of claim 1, wherein said active region comprises a sequence of layers A-B-(C-B)xn-A, wherein layer A comprises $Al_pGa_{1-p}As$ ($0 \leq p \leq 1$), layer B comprises $Al_qGa_{1-q}N_rP_sAs_tSb_{1-r-s-t}$ ($0 \leq q \leq 1$, $0<r<0.1$, $0 \leq s \leq 1$, $0<t<1$), and layer C comprises $In_wGa_{1-w}N_xP_yAs_zSb_{1-x-y-z}$ ($0 \leq w \leq 1$, $0<x<0.1$, $0 \leq y \leq 0.6$, $0<z<1$), and wherein the sequence of layers (C-B) is repeated in adjacent succession n times, n being an integer number larger than 1, and wherein the band structure formed between layers B and C has a type-I band-edge alignment.

7. The device of claim 1, wherein said active region comprises a sequence of layers A-B-C-D-B-A, wherein layer A comprises $Al_pGa_{1-p}As$ ($0 \leq p \leq 1$), layer B comprises $Al_qGa_{1-q}N_rP_sAs_tSb_{1-r-s-t}$ ($0 \leq q \leq 1$, $0<r<0.1$, $0 \leq s \leq 1$, $0<t<1$), and layer C comprises $In_wGa_{1-w}N_xP_yAs_zSb_{1-x-y-z}$ ($0 \leq w \leq 1$, $0<x<0.1$, $0 \leq y \leq 0.6$, $0<z<1$), layer D comprises $In_aGa_{1-a}N_bAs_{1-b}$ ($0 \leq a \leq 1$, $0<b<0.1$), and wherein the band structure formed between layers B and C has a type-I band-edge alignment, and wherein the band structure formed between layers B and D has a type-I band-edge alignment, and wherein the band structure formed between layers C and D has a type-II band-edge alignment.

8. The device of claim 1, wherein said active region comprises a sequence of layers A-B-(C-D-B)xn-A, wherein layer A comprises $Al_pGa_{1-p}As$ ($0 \leq p \leq 1$), layer B comprises $Al_qGa_{1-q}N_rP_sAs_tSb_{1-r-s-t}$ ($0 \leq q \leq 1$, $0<r<0.1$, $0 \leq s \leq 1$, $0<t<1$), layer C comprises $In_wGa_{1-w}N_xP_yAs_zSb_{1-x-y-z}$ ($0 \leq w \leq 1$, $0<x<0.1$, $0 \leq y \leq 0.6$, $0<z<1$), layer D comprises $In_aGa_{1-a}N_bAs_{1-b}$ ($0 \leq a \leq 1$, $0<b<0.1$), and wherein the sequence of layers (C-D-B) is repeated in adjacent succession n times, n being an integer number larger than 1, and wherein the band structure formed between layers B and C has a type-I band-edge alignment, the band structure formed between layers B and D has a type-I band-edge alignment, and the band structure formed between layers C and D has a type-II band-edge alignment.

9. The device of claim 1, wherein said active region comprises a sequence of layers A-B-D-C-B-A, wherein layer A comprises $Al_pGa_{1-p}As$ ($0 \leq p \leq 1$), layer B comprises $Al_qGa_{1-q}N_rP_sAs_tSb_{1-r-s-t}$ ($0 \leq q \leq 1$, $0<r<0.1$, $0 \leq s \leq 1$, $0<t<1$), and layer C comprises $In_wGa_{1-w}N_xP_yAs_zSb_{1-x-y-z}$ ($0 \leq w \leq 1$, $0<x<0.1$, $0 \leq y \leq 0.6$, $0<z<1$), layer D comprises $In_aGa_{1-a}N_bAs_{1-b}$ ($0 \leq a \leq 1$, $0<b<0.1$), and wherein the band structure formed between layers B and C has a type-I band-edge alignment, the band structure formed between layers B and D has a type-I band-edge alignment, and the band structure formed between layers C and D has a type-II band-edge alignment.

10. The device of claim 1, wherein said active region comprises a sequence of layers A-B-(D-C-B)xn-A, wherein layer A comprises $Al_pGa_{1-p}As$ ($0 \leq p \leq 1$), layer B comprises $Al_qGa_{1-q}N_rP_sAs_tSb_{1-r-s-t}$ ($0 \leq q \leq 1$, $0<r<0.1$, $0 \leq s \leq 1$, $0<t<1$), layer C comprises $In_wGa_{1-w}N_xP_yAs_zSb_{1-x-y-z}$ ($0 \leq w \leq 1$, $0<x<0.1$, $0 \leq y \leq 0.6$, $0<z<1$), layer D comprises $In_aGa_{1-a}N_bAs_{1-b}$ ($0 \leq a \leq 1$, $0<b<0.1$), and wherein the sequence of layers (D-C-B) is repeated in adjacent succession n times, n being an integer number larger than 1, the band structure formed between layers B and C having a type-I band-edge alignment, the band structure formed between layers B and D having a type-I band-edge alignment and the band structure formed between layers C and D having a type-II band-edge alignment.

11. The device of claim 1, wherein said active region comprises a sequence of layers A-B-D-C-D-B-A, wherein layer A comprises $Al_pGa_{1-p}As$ ($0 \leq p \leq 1$), layer B comprises $Al_qGa_{1-q}N_rP_sAs_tSb_{1-r-s-t}$ ($0 \leq q \leq 1$, $0<r<0.1$, $0 \leq s \leq 1$, $0<t<1$), and layer C comprises $In_wGa_{1-w}N_xP_yAs_zSb_{1-x-y-z}$ ($0 \leq w \leq 1$, $0<x<0.1$, $0 \leq y \leq 0.6$, $0<z<1$), layer D comprises $In_aGa_{1-a}N_bAs_{1-b}$ ($0 \leq a \leq 1$, $0<b<0.1$), and wherein the band structure formed between layers B and C has a type-I band-edge alignment, the band structure formed between layers B and D has a type-I band-edge alignment, and the band structure formed between layers C and D has a type-II band-edge alignment.

12. The device of claim 1, wherein said active region comprises a sequence of layers A-B-(D-C-D-B)xn-A, wherein layer A comprises $Al_pGa_{1-p}As$ ($0 \leq p \leq 1$), layer B comprises $Al_qGa_{1-q}N_rP_sAs_tSb_{1-r-s-t}$ ($0 \leq q \leq 1$, $0<r<0.1$, $0 \leq s \leq 1$, $0<t<1$), layer C comprises $In_wGa_{1-w}N_xP_yAs_zSb_{1-x-y-z}$ ($0 \leq w \leq 1$, $0<x<0.1$, $0 \leq y \leq 0.6$, $0<z<1$), layer D comprises $In_aGa_{1-a}N_bAs_{1-b}$ ($0 \leq a \leq 1$, $0<b<0.1$), and wherein the sequence of layers (D-C-D-B) is repeated n times in adjacent succession, n being an integer number larger than 1, and wherein the band structure formed between layers B and C has a type-I band-edge alignment, the band structure formed between layers B and D has a type-I band-edge alignment, and the band structure formed between layers C and D has a type-II band-edge alignment.

13. The device of claim 1, wherein said active region comprises a sequence of layers A-B-(C-D-CB)xn-A, wherein layer A comprises $Al_pGa_{1-p}As$ ($0 \leq p \leq 1$), layer B comprises $Al_qGa_{1-q}N_rP_sAs_tSb_{1-r-s-t}$ ($0 \leq q \leq 1$, $0<r<0.1$, $0 \leq s \leq 1$, $0<t<1$), layer C comprises $In_wGa_{1-w}N_xP_yAs_zSb_{1-x-y-z}$ ($0 \leq w \leq 1$, $0<x<0.1$, $0 \leq y \leq 0.6$, $0<z<1$), layer D comprises $In_aGa_{1-a}N_bAs_{1-b}$ ($0 \leq a \leq 1$, $0<b<0.1$), and wherein the sequence of layers (C-D-C-B) is repeated in adjacent succession n times, n being an integer number larger than 1, and wherein the band structure formed between layers B and C has a type-I band-edge alignment, the band structure formed between layers B and D has a type-I band-edge alignment and the band structure formed between layers C and D has a type-II band-edge alignment.

14. The device of claim 2 or 3, wherein at least one of said plurality of layers comprising said active region acquires quantum dots during a growth process in which said at least one layer is formed.

15. The device of claim 2, wherein the wavelength of light that may be processed by the device at a temperature of about 300 K is at least about 1150 nm.

16. The device of claim 2, wherein the wavelength of light that may be processed by the device is at least about 1150 nm at temperatures greater than about 300 K.

17. The device of claim 2, wherein the wavelength of light that may be processed by the device is at least about 1150 nm at temperatures less than about 300 K.

18. The device of claim 2, wherein said substrate comprises GaAs having a lattice constant.

19. The device of claim 2, wherein said substrate comprises GaAs in combination with an additional substrate constituent selected from the group consisting of: Al, In, and a dopant.

20. The device of claim 2, further comprising: (c) a first conductive layer having a first conductivity type and placed in electrical contact with said active region; (d) a second conductive layer having a second conductivity type and placed in electrical contact with said active region; and(e) an electrical connection to said active region, wherein said electrical connection is constructed to one of: (i) supply electrical current to said active region; and (ii) receive electrical current from said active region.

21. The device of claim 20, wherein a bandgap associated with said first and second conductive layers is larger than that of any bandgap associated with said sequence of layers in said active region.

22. The device of claim 20, further comprising a semiconductor-air interface, wherein said semiconductor-air interface is adapted for light processing.

23. The device of claim 22, wherein said semiconductor-air interface includes one of an etched surface and a cleaved surface constructed to form a cavity normal to a plane substantially parallel to each of said plurality of layers.

24. The device of claim 20, further comprising: (f) a grating layer disposed above said second conductive layer, wherein said grating layer contains lines extending over at least a portion of said active region, and wherein said grating layer defines an optical cavity having an optical resonance, with the resonance being associated with a resonance wavelength corresponding to a resonance energy, and wherein the resonance wavelength in microns as measured in a vacuum is about equal to 1.24 divided by the resonance energy measured in electron volts.

25. The device of claim 24, wherein the grating lines are shifted by n multiplied by one quarter of the wavelength, wherein n is an integer greater than or equal to 1, whereby a phase-shifted grating is formed.

26. The device of claim 20, further comprising: (f) a bottom mirror placed underneath said active region; and (g) a top mirror placed above said active region, said mirrors defining an optical cavity resonance associated with a resonance energy and a corresponding resonance wavelength, and wherein the resonance wavelength in microns as measured in a vacuum is about 1.24 divided by the resonance energy measured in electron volts.

27. The device of claim 26, wherein said bottom mirror comprises a plurality of higher-refractive-index and lower-refractive-index layers in alternating adjacent disposition.

28. The device of claim 27, wherein at least one of said plurality of bottom mirror layers of lower-refractive-index comprises oxidized material.

29. The device of claim 26, wherein said top mirror comprises a plurality of higher-refractive-index and lower-refractive-index layers in alternating adjacent disposition.

30. The device of claim 29, wherein each said lower-refractive-index layer is selected from the group consisting of: oxidized material; low-index dielectric material; and low index semiconductor material.

31. The device of claim 29, wherein each said higher-refractive-index layer is chosen from the group consisting of: high-index dielectric material; and high index semiconductor material.

32. The device of claim 20, further comprising: (f) a two-region aperture disposed between said top mirror and said active region.

33. The device of claim 32, wherein a first region of said two-region aperture has a relatively low electrical resistance and a second region of said two-region aperture has an electrical resistance that is higher than the resistance of said first region of said aperture.

34. The device of claim 32, wherein a first region of said two-region aperture has a refractive index that is higher than the refractive index of a second region of said two-region aperture.

35. The device of claim 32, wherein said two-region aperture comprises oxidized material and wherein a second region of said aperture is more highly-oxidized than a first region of said aperture.

36. The device of claim 32, wherein said two-region aperture includes an etched pillar structure.

37. The device of claim 32, wherein said device comprises one of a resonant cavity photodetector (RCPD), a resonant cavity light emitting diode (RCLED), a vertical cavity surface emitting laser (VCSEL), and a vertical cavity surface emitting laser for fiber optic data communications.

38. The device of claim 37, wherein said device has an operating wavelength between about 1260 nm and about 1360 nm.

39. The device of claim 37, wherein said device has an operating wavelength between about 1360 nm and about 1460 nm.

40. The device of claim 37, wherein said device has an operating wavelength between about 1460 nm and about 1610 nm.

41. The device of claim 20, wherein said device comprises an optical modulator.

42. A light processing device comprising:

a substrate including a semiconductor material having a lattice constant; and an active region supported by the substrate and comprising a plurality of layers formed in one of a sequence of layers A-B-C-B-A, a sequence of layers A-B-C-D-B-A, a sequence of layers A-B-D-C-B-A, and a sequence of layers A-B-D-C-D-B-A, wherein layer A comprises $Al_pGa_{1-p}As$ ($0 \leq p \leq 1$), layer B comprises $Al_qGa_{1-q}N_rP_sAs_tSb_{1-r-s-t}$ ($0 \leq q \leq 1$, $0 < r < 0.1$, $0 \leq s \leq 1$, $0 < t < 1$), layer C comprises $In_wGa_{1-w}N_xP_yAs_zSb_{1-x-y-z}$ ($0 \leq w \leq 1$, $0 < x < 0.1$, $0 \leq y \leq 0.6$, $0 < z < 1$), and layer D comprises $In_aGa_{1-a}N_bAs_{1-b}$ ($0 \leq a \leq 1$, $0 < b < 0.1$), and wherein the band structure formed between layers B and C has a type-I band-edge alignment, the band structure formed between layers B and D has a type-I band-edge alignment, and the band structure formed between layers C and D has a type-II band-edge alignment.

43. A light processing device comprising:

a substrate including a semiconductor material having a lattice constant; and an active region supported by the substrate and comprising a plurality of layers formed in one of a sequence of layers A-B-(C-B)xn-A, a sequence of layers A-B-(C-D-B)xn-A, a sequence of layers A-B-(D-C-B)xn-A, a sequence of layers A-B-(D-C-D-B)xn-A, and a sequence of layers A-B-(C-D-C-B)xn-A, wherein layer A comprises $Al_pGa_{1-p}$ ($0 \leq p \leq 1$), layer B comprises $Al_qGa_{1-q}N_rP_sAs_tSb_{1-r-s-t}$ ($0 \leq q \leq 1$, $0 < r < 0.1$, $0 \leq s \leq 1$, $0 < t < 1$) layer C comprises $In_wGa_{1-w}N_xP_yAs_zSb_{1-x-y-z}$ ($0 \leq w \leq 1$, $0 < x < 0.1$, $0 \leq y \leq 0.6$, $0 < z < 1$), and layer D comprises $In_aGa_{1-a}N_bAs_{1-b}$ ($0 \leq a \leq 1$, $0 < b < 0.1$), wherein each of the sequences of layers (C-B), (C-D-B), (D-C-B), (D-C-D-B), and (C-D-C-B) is repeated in adjacent succession n times, n being an integer number larger than 1, and wherein the band structure formed between layers:B and C has a type-I band-edge alignment, the band structure formed between layers B and D has a type-I band-edge alignment, and the band structure formed between layers C and D has a type-II band-edge alignment.

* * * * *